United States Patent [19]
Easton et al.

[11] Patent Number: 5,371,842
[45] Date of Patent: Dec. 6, 1994

[54] SYSTEM FOR REAL-TIME DISPLAY OF THE WAVESHAPE OF AN INCOMING STREAM OF DIGITAL DATA SAMPLES

[75] Inventors: Paul Easton, Calgary; Pierre Goyette, St-Jean-sur-Richelieu, both of Canada

[73] Assignee: BioScience Analysis Software Ltd., Calgary, Canada

[21] Appl. No.: 523,446

[22] Filed: Apr. 19, 1990

[51] Int. Cl.$^5$ .............................................. G06F 15/62
[52] U.S. Cl. ...................................... 395/140; 395/142; 395/161
[58] Field of Search ................... 395/101-103, 395/140-143, 155-156, 161, 128, 129, 133, 139, 134, 138, 149; 382/47

[56] References Cited

U.S. PATENT DOCUMENTS

| | | |
|---|---|---|
| 4,038,668 | 7/1977 | Quarton ........................... 395/142 |
| 4,146,925 | 3/1979 | Green et al. .................... 395/142 X |
| 4,587,621 | 5/1986 | DuVall ............................ 382/47 X |
| 4,809,195 | 2/1989 | Bechet ............................. 395/142 |
| 5,046,024 | 9/1991 | Smith et al. .................... 395/142 X |
| 5,121,470 | 6/1992 | Trautman ........................ 395/155 X |

Primary Examiner—Heather R. Herndon
Assistant Examiner—Almis Jankus
Attorney, Agent, or Firm—Fliesler, Dubb, Meyer & Lovejoy

[57] ABSTRACT

The data flow rate of a first series of sample values generated over time is reduced to a rate acceptable for real time plotting by generating a second series of sample values where each sample in the second series is representative of a plurality of samples in the first series. The times of the representative values are representative of the times of nonplotted values. Plotting density is increased by plotting only representative values and/or representative time points.

34 Claims, 18 Drawing Sheets

Microfiche Appendix Included
(598 Microfiche, 7 Pages)

The DataSponge: COLLECT V2.01 date time MENU: Page 2

COLLECT MENU

ACTION:
    <ENTER>    start COLLECT
    <X>    stop COLLECT

DATA:
    <F3>    creat/select a Data file
    <F5>    specify a Timed data collection
    ⌐<F3>⌐    select another Calibration file
    ⌐<F4>⌐    view the Calibration file Summary DISPLAY:
    <F6>    adjust Proportion of data displayed
    <F7>    select Channels to display
    <F8>    select Colors for display ASSIST:
    <F2>    review COLLECT Action keys
    <F1>    help
    <ESC>    exit LEGEND:  <Fn> = Function Key
            ⌐⌐ = Shifted Key

FIG. 4A

The DataSponge: CALIBRATE V2.01 date time MENU: Page 3

CALIBRATE MENU

| | | |
|---|---|---|
| COLLECTION PARAMETERS: | <F3> | create/select Calibration file |
| | <F4> | view the Calibration file summary |
| | <F5> | select channels, gain, sampling rate |
| | <F9> | select Manual or Program collection |
| | <ALT-N> | record Calibration Note |
| | <CTRL-ENTER> | save/change the Calibration file |
| CHANNEL CALIBRATION: | <ALT-#> | calibrate channel (#=1→8) |
| | <F2> | review channel calibration Action keys |
| DATA DISPLAY: | <F6> | adjust proportion of data displayed |
| | <F7> | select Channels to display |
| | <F8> | select Colors to display |
| | <ALT-P> | select printer configuration |
| ASSIST: | <F1> | help |
| | <ESC> | exit |

FIG. 4B

The DataSponge: CALIBRATE V2.01 date time MENU: Page 4

Collection Parameters
Calibration File: C:\DIREC\SELECTED.CAL

Summary: Panel A

Active
Channels:  first    1
           final    8

Real time factor    0
A/D Board Gain      1

| | Variable |
|---|---|
| Sampling Rate per channel (Hertz) 1 | +100 |
| 2 | +100 |
| 3 | +100 |
| 4 | +100 |
| 5 | +200 |
| 6 | +200 |
| 7 | +800 |
| 8 | +800 |

Note: One full paragraph of information about the details and conditions of data acquisition can be stored within the calibration file note TALKBOX
<ENTER> for more calibration information
<ESC> to exit, <F1> for help

FIG. 4C

The DataSponge: CALIBRATE V2.01 date time MENU: Page 8

Channel summary         Channel 1         C:\DIREC\FRESH.CAL

Channel title   [Any name]

Channel type   [PHYS]

[   4   ]
                Calibration points

TALKBOX
Select channel type, then <TAB> or <ENTER>.
<F9> to set calibration sampling parameters
<F5> to calibrate this channel
<CTRL-ENTER> to update > CAL file. <ESC> to return to
MENU. <F1> for help

FIG. 4D

The DataSponge: CALIBRATE V2.01 date time MENU: Page 9

Channel calibration      Channel 1      Channel title

| | Voltage input | | A/D number | | Physical measurement | |
|---|---|---|---|---|---|---|
| Calibration point number | mean | 2.45 | mean SD samples | 1867 0.782 450 | value | 23.8 |
| 2 | | | | | | |

Calibration equation

| Unit physical measure= | 0.783 | A/D# + | 10.65036 | R2 | 0.936 |
|---|---|---|---|---|---|
| Unit physical measure= | 1.2673 | volts + input | -14.939 | | |

TALKBOX
<ENTER> to accept this pair. <F10> to reject this pair
<F5> to save as Low guideline, <F6> to save as High guideline.
<ESC> to return to the channel summary. <F1> for help.

FIG. 4E

The DataSponge: CALIBRATE V2.01 date time MENU: Page 6

Method: KEYPRESS          PROGRAM MODE: START

Channel: 2   .Threshold: ASCENDING    Value type: VOLTS    Value: +1.0

PROGRAM MODE: TERMINATE

Method to terminate data collection  VALUE TRIGGER   Value type VOLTS  Value  4.80

Threshold ASCENDING

Trigger Channel  2

TALKBOX
Type the numeric value of the trigger threshold.
<TAB>, or <RIGHT> or <LEFT> arrow to select the threshold, value type, or value.
Type desired value for the numeric trigger, then <ENTER>
<ESC> returns to CALIB. MENU. <F1> for help.

FIG. 4F

The DataSponge: CHART V2.01 date time MENU: Page 18

Input files:
Calibration file:   C:\DIREC\SELECTED.CAL
Data file:          C:\SPONG\CHOSEN.DAT

| | Channels | | Guidelines | | Guidelines values |
|---|---|---|---|---|---|
| Name 1 | INCLUDE | | INCLUDE | | INCLUDE |
| Name 2 | INCLUDE | | OMIT | | OMIT |
| Name 3 | INCLUDE | | OMIT | | OMIT |
| Name 4 | INCLUDE | | INCLUDE | | INCLUDE |
| Name 5 | INCLUDE | | OMIT | | OMIT |
| Name 6 | INCLUDE | | OMIT | | OMIT |
| Name 7 | OMIT | | OMIT | | OMIT |
| Name 8 | OMIT | | OMIT | | |

TALKBOX

Use <UP> or <DOWN> arrow keys to OMIT/INCLUDE Channels, channel guidelines, and guideline values.
Use <SHIFT-TAB>, <TAB>, or <ENTER> to move to next item
<ENTER> to move to next item.
Press <CTRL-ENTER> to accept all entries, and return to CHART MENU.
<ESC> to exit, <F1> for help.

FIG. 6

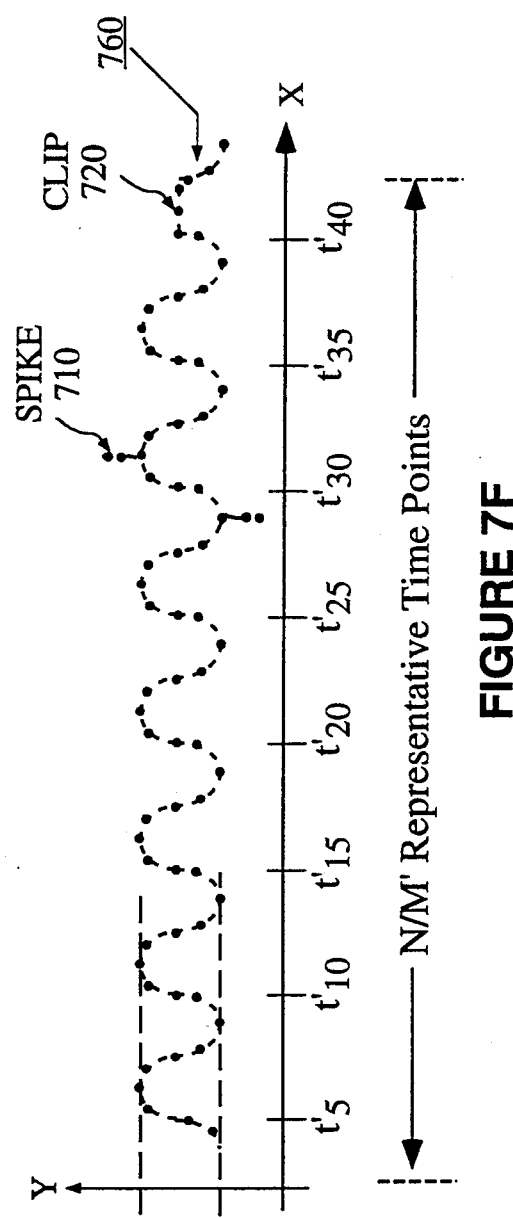

SYSTEM FOR REAL-TIME DISPLAY OF THE WAVESHAPE OF AN INCOMING STREAM OF DIGITAL DATA SAMPLES

BACKGROUND OF THE INVENTION

1. Cross Reference To Microfiche Appendix

This application includes a computer program listing in the form of Microfiche Appendix A which is being filed concurrently herewith as 655 frames (not counting target and title frames) distributed over 7 sheets of microfiche in accordance with 37 C.F.R. §1.96. The disclosed computer program listing is incorporated into this specification by reference but it should be noted that the source code and/or the resultant object code are subject to copyright protection. The copyright owner has no objection to the facsimile reproduction by anyone of the patent document (or the patent disclosure as it appears in the files or records of the U.S. Patent and Trademark Office) for the purpose of studying the disclosure but otherwise reserves all other rights to the disclosed computer program including the right to reproduce said computer program in machine-executable form.

2. Field of the Invention

This invention relates generally to a data acquisition system having a capability to display in plotted from one or more continuous streams of digital data samples and more specifically to a display system which uses a combination of standard computer graphic display adaptors and graphic monitors together with specialized software for the real-time production of sample point plots.

3. Description of the Relevant Art

The need to visualize or display in real time a graphic image of continuous streams of data emanating from one or more measurement instruments during data acquisition is well known. By way of example, medical experiments or tests tend to produce voluminous amounts (i.e., more than 1000 points or more than 1,000,000 points) of result data and it is desirable to know from the outset of data collection whether the produced results are within a generally expected range. It is also preferable to know immediately when unusual results are being produced so they can be immediately noted, corrected and/or investigated if so desired.

The preferred display mode is a real-time graphic one. That is, waveshape recognition or recognition of other graphic information relating to the collected data should occur simultaneously or almost simultaneously with the production of data. Preferably, the display image should be of a form that can be permanently retained for re-production and study at later times.

Traditionally, real-time graphic display and permanent storage of result information have been achieved in unison through the use of a conventional paper chart recorder. A voltage signal or other signal of interest is amplified as necessary and applied to move a recording pen across the surface of a continuously streaming paper chart (or "strip chart"). A waveshape of the received information is thereby continuously inscribed onto a paper record and supplied cut of the recorder for immediate viewing. The paper trace provides a nearly real-time visual display of the time versus voltage characteristics of the signal or of other signal characteristics that are to be studied, and the paper record stores the image for later re-examination.

Because traditional chart recorders employ ink pens or other mechanical parts to write the signal image to paper, they cannot faithfully display, in real time, rapidly changing signals such as for example signals having a frequency component of 200 Hz or more.

Recently, paper recording devices have been devised which digitize incoming analog voltage signals and inscribe the digitized form to paper using a rapidly responding printing means such as a thermal writing micro-array or by using electro-static or photographic methods of recording on paper. Examples of such devices include the Gould Electronics Model TA2000 or ES 2000 Electrostatic Recording stem, by Gould Inc. Recording Systems, 3631 Perkins Avenue, Cleveland, Ohio, 44114; and the Model ME-9500 8-channel recorder by Astromed Inc., West Warwick, R.I., U.S.A.

These newer recorders can reliably display in real-time signals having a maximum frequency of approximately 5 to 8 kHz. The new digitizing recorders are provided with features such as adjustable "paper speeds", i.e. the rate at which signals are inscribed and paper is rolled out is adjustable, so as to allow for either compression of long durations of slow-changing signals into a single short length of paper, or alternatively by using rapid paper speed, to allow brief events to be expanded over long segments of rapidly streaming paper for high event resolution.

But despite such features, the newer recorders still have disadvantages. Aside from having a restriction on the maximum signal frequency which can be reliably displayed, (no higher than about 8 kHz), these newer forms of digitizing recorders suffer from the fact that both the real-time nature of the display and the storage of the display depends on paper or some other write-once recording medium which has the disadvantages of being non-reusable, expensive to purchase, inconvenient to review and bulky to store.

Recently, attempts have been made to use the data acquisition and storage capabilities of so-called personal computers (low-cost microcomputers) to collect, and store for later study, sample values of analog signals. A typical IBM PC or compatible microcomputer is used in combination with a suitable magnetic medium type of storage device (e.g. a "hard" disk), an analog to digital signal adaptor board, and a video display driver (e.g. color graphics adaptor (CGA), enhanced graphics adaptor (EGA), or virtual graphics array (VGA)). The analog to digital adaptors usually come in the form of a single printed circuit board, which includes an analog to digital converter (A/D) system. The adaptor board is inserted into a standard computer bus slot in the personal microcomputer to provide the necessary hardware components for digitizing analog signals. Single board A/D adaptor systems are manufactured and marketed, for example, by companies such as Data Translation, Inc., 100 Locke Drive, Marlborough, Mass., 01752, Scientific Solutions, 6225 Cochran Road, Solon, Ohio, 44139, and National Instruments, 12109 Technology Boulevard, Austin, Tex., 78727-6204.

When driven by suitable software, these combinations of a personal computer plus one or more A/D adaptor boards have the capability of receiving continuous analog voltage signals on plural A/D channels, digitizing the voltage signals to generate a representative stream of sequential sample point values, passing the digital sample point values to a random access memory (RAM) buffer section of the computer and from there to permanent storage in the files of a magnetic disk.

Some A/D adaptor boards are provided with relatively high performance components to allow direct memory access (DMA) transfer of binary data from RAM to disk so that signal digitization and transfer can take place at the peak rate of the A/D converter system and thus faithful recording of signals having relatively high frequency content is made possible.

Currently, there are several software programs on the market which provide total throughput rates (sampling, digital data transfer to RAM, and permanent hard disk storage) which roughly match the maximum rate of digitization of the A/D converter system taken alone. For example, using an ASYST TM software package (McMillan Software Company, 866 Third Avenue, New York, N.Y., 10022), together with Data Translation's "high speed" A/D board Model No. 2821F, one can continuously sample and store to permanent disk storage at rates as high as approximately 130,000 samples/second (thereby allowing for faithful reproduction of signals having a maximum frequency of 65 KHz or less). But this high speed performance applies only for retention of signal information and not to systems where the sampled information is to be simultaneously displayed as a graphic plot during data collection.

Display systems tend to have a bit rate limitation, independent of the A/D system bit rate limitation, which prevents sample points from being displayed in plotted form at rates higher than a fixed number of sample points per second. Accordingly, even as A/D digitizing rates rise and maximum computer to storage data transfer rates increase, the display rate limitation acts as a bottleneck which prevents real-time display on a point-by-point basis of the incoming signal samples. Heretofore, the operation of sampling and storage had to be conducted in the "blind" if one wished to avoid the display rate limitation. But this mode of blind collection is undesirable in that it deprives the experimenter of valuable information. Blind data collection leaves the user without the option to take immediate corrective action should something go awry.

When currently available A/D boards sample incoming voltage signals at standard, moderate to high sampling rates, the number of digital data points generated by the A/D system can easily exceed the ability of the host computer's video display driver and/or monitor to immediately display the entirety of the continuous stream of data points onto screen. The computer display subsystem cannot keep pace with the A/D subsystem, and therefore cannot display in real-time the waveshapes of signals being received by the A/D subsystem.

In existing software packages, when a voltage signal is digitized by the A/D board, each successively digitized sample point value is converted by the computer into X and Y screen coordinates, as it is received, and it is then processed sequentially via the video display driver and plotted to the screen. Since a finite time interval is required for mapping into screen coordinates and writing each successive point into a video buffer, a display rate limit is imposed by both the computer hardware and the application software upon the rate of continuous data sampling that can be visualized. That is, there is a limit on the maximum signal frequency that can be adequately displayed in real-time, while sample data is being produced. Additionally, when real time storage is required, time has to be allotted in each processing cycle for the computer to store the incoming data samples in appropriate locations on the magnetic disk. This storage time further limits the maximum signal frequency that can be displayed in real-time.

Ideally, users would like to view the waveshapes of incoming signals, even those having relatively high frequency, and to simultaneously record the waveshapes permanently for later review by suitable analysis means (i.e. software types of signal analysis tools) utilizing low-cost computers, A/D board and software. But heretofore, a low-cost combination of hardware and software has not been available for realizing such a goal.

A computer program sold under the name Lab Tech Notebook TM by Laboratory Technologies Corporation, 400 Research Drive, Wilmington, Mass., 01887, is representative of the peak performance available from prior art data acquisition programs. The maximum rate of continuous sampling and permanent storage of incoming data that is possible while simultaneously providing a real-time display is limited in prior art systems to a maximum total rate of sampling not greater than approximately one thousand samples per second. When a typical number of (i.e., 8) separate signals are to be processed in a time multiplexed manner on a corresponding number of (i.e., 8) channels, the maximum rate at which each individual signal can be sampled, visualized, and stored is divided down to a restrictively low rate of approximately 100–200 samples per second (SPS). Thus, previously existing programs cannot successfully display in real-time and simultaneously store incoming signals, except at very slow rates of sampling (i.e., 100–200 SPS per channel) that are only a fraction of the the maximum sampling rates (i.e., 16,000 SPS per channel) available with many popular A/D boards. At higher rates of sampling, either the display points have to be visualized on a non real-time basis, i.e., they lag in time behind the newest burst of incoming data points, or the display capability is simply not available and data collection takes place in the "blind".

Besides this inability to display data in real-time, previously existing data acquisition software packages have not been able to quickly provide any permanent printed record equivalent to the output of the traditional paper recorder. Thus, if a disk "crash" occurs well after the time of an in-the-blind collection session but before there is time to make a hard-copy print-out of the data collected, the entirety of the results from the experiment may be lost without giving the experimenter a chance to visualize or review even gross aspects of the results. The fruits of all efforts put into conducting the experiment are completely destroyed.

With respect to visualizing the experimental results, post-collection "playback" or "replay" of stored digital data could satisfy the requirement for a reviewable, permanent record of the experimental results, but this does not allow for the same kind of immediate feedback and optional reaction made possible by displaying incoming data in real-time. While a subsequently printed hard-copy plot of the results might be provided as a reviewable record after the facts, the production of a visually pleasing and/or useful record usually requires some degree of a priori knowledge. Certain functional features found in the conventional chart recorders, such as the ability to select different paper speeds "on the fly" (as the experiment is proceeding) turn out to be extremely useful. Most digital printers feed their paper at a fixed speed making such "on the fly" adjustments to paper speed impossible. If an eye-pleasing plot is to be produced, it is advantageous to give the experimenter the ability to adjust the characteristics of the data acquisition system in real time (at the time the experiment is being carried out) rather than waiting till later and relying only on post-experiment data-editing processes so that a visually pleasing and thereby more useful record is immediately produced. It is undesirable to wait until after the experiment has been completed and to realize only then that perhaps changes should have been made to the data collecting process, i.e., some segments of a hard-copy print-out whose specific locations are now forgotten should have been compressed by using slow paper speed and others should have been expanded by using a faster paper speed so as to emphasize key portions of the result data.

Even before an experimental run begins, it is useful to have knowledge of the magnitude range and frequency range of the initial waveshapes generated during the set-up of the experiment. The experimenter should be able to dynamically use this knowledge to adjust the recording instrumentation during set-up, before the experiment begins, in order to produce a visually useful and more pleasing record. Ideally, the experimenter should be able to stretch the amplitude of each waveform plot so that it occupies the full vertical span of the display screen and thus provides maximum magnitude resolution on screen if so desired. And the experimenter should also be able to alter the horizontal spacing between plot points on screen in real-time so as to optimize visual appreciation of time related characteristics (i.e., slope or frequency) of one or more plotted waveforms. It is difficult for a human being to produce an acceptable plot (video or hardcopy) having such effects after a "blind" digital collection session because the only information available prior to beginning such a plot is a digital data file which is stored on a computer hard disk in the form of a series binary-coded values. Direct print-out of such a file provides only a list of numbers in text form, not a graphic plot whose attributes are adjustable on the fly.

The best of the previously available combinations of personal computers, single board A/D systems, printers and data acquisition software fail to fulfill the need for a low-cost data acquisition system which provides continuous real-time display of visually pleasing plots and reviewable storage of high frequency input signals. Even the capabilities of the earlier paper chart recorders are not matched by these personal computer forms of data acquisition systems.

Attempts have been made to circumvent the inability of the low-cost personal computer systems (video graphics adaptors, monitors and software) to successfully "keep up with" and plot each successive incoming data point as it is digitized by the A/D board. But these attempts have directed themselves to the use of high cost and very specialized computer hardware. Dedicated hardware has been designed by some to supplement or accelerate the capability of the video adaptor which drives the microcomputer monitor and thereby enable a limited form of real-time data acquisition and display. This hardware attempt does not address, however, a limitation which arises primarily from the software control program, namely that it takes the microprocessor a finite amount of time to map each raw binary number representing a signal level into a memory address associated with specific screen coordinates and to transfer such mapped (transformed) data to a video buffer. The software limitation remains despite hardware augmentation to the system video driver board.

The above mentioned use of specialized computer hardware has been popularized by the CODAS system available from DATA Instruments Inc., 825 Sweitzer Avenue, Akron, Ohio, 44398-6140. A proprietary and dedicated videoboard ("scrolling" board) is inserted into a predetermined slot in the microcomputer to increase the real-time display rate of the computer monitor in a specific "scrolling" format. That is, the addition of the CODAS, "scrolling" board allows the microcomputer monitor to more rapidly write to screen each successive digital data point as it is generated by exploiting additional hardware plus software to continuously and automatically "scroll" the display, i.e., to continuously roll all of the visual information on the screen with the latest points appearing at one edge of the screen while the oldest points pass off and disappear at the opposite side of the screen. When this CODAS board plus accompanying software is used with standard personal computer systems (A/D boards and monitors), a modest increase in real-time display and storage of digital data samples is realized, typically to a maximum of 4,000 samples per second. This means that when the more powerful of standard microcomputers are used (i.e. an Intel 80386 system) in combination with a high throughput rate (50-130 kHz) A/D board system, the maximum rate of display sampling and storage available for a typical set of 8 incoming voltage signals would be a maximum of 500 samples per second per channel. Such performance still compares unfavorably against the maximum display and storage throughput of the older chart recorders, and this display solution does not yet provide a permanent reviewable log since the waveshapes are shown only momentarily on a scrolling video display.

The attempts to substitute or add specialized hardware to work around the failings of standard computer systems (A/D board, and software) has recently been carried a step further in another type of CODAS system by the same DATA Instruments company. Additional, more specialized, hardware has been created in the form of an advanced "scrolling board" which removes the standard A/D card from the computer system and replaces it with a proprietary combination board which includes both a videographic scrolling capability and analog/digital conversion circuitry. When a computer is outfitted with this special "scrolling" board, a maximum of 50,000 digital data samples per second (approximately 6,000 SPS per channel in an 8 channel system) can be passed to hard disk storage while continually being displayed in a special "scrolling" display format.

Thus, by supplanting the commercially standard computer video adaptors previously used, abandoning the standard A/D board design, and turning to a custom scrolling screen display format requiring a special item of hardware, the newer CODAS system is able to provide a moderate rate of real-time display and store the displayed points for later review on screen.

While this display ability does finally rival the ability of the traditional paper recorder to display moderate frequency signals of several kHz, it is realized with the penalty of severe restrictions. A first penalty arises in that the real-time scrolling display does not allow for a full vertical resolution across the video screen as provided across the paper width of contemporary electrostatic paper recorders because the size of the scroll buffer has to be limited. And the only record made available for later review by the "scrolling" board is the same scrolling display created during real-time acquisition. Another penalty comes from the fact that the standard video graphics adaptors have been supplanted by proprietary single-vendor hardware, and accordingly, many common A/D boards which could offer greater sampling performance and/or lower cost are not compatible. Thus, it can be seen that such hardware augmentation only circumvents but does not overcome an inherent limitation of the data acquisition process, namely, the time it takes a CPU to map into display coordinates and transfer to a screen or printer the raw sample point data produced by the A/D board.

Data acquisition software needs to be designed which can overcome the mapping limitation and successfully generate a real-time display of incoming data at the highest rates of sampling of contemporary A/D boards, or accommodate even higher rates of future planned A/D boards. The real-time display of incoming data should appear relatively continuous despite simultaneous transfer of bursts of incoming data to permanent storage (i.e., hard disk) and despite improvements to the rate at which the hard disk or other medium can physically accept the flow of incoming data. That is, the displayed plots should not lag in time by any appreciable amount behind the latest salvo of result data that is being produced by the measurement equipment. The maximum sampling rate and permanent storage rate of incoming data points should be limited only by the speed of the A/D subsystem and the ability of the storage medium to accept the flow of data, not by the limitations of the display system. All this should preferably be achieved through software modification rather than hardware addition so that the necessity or cost of adding specialized hardware to enhance performance or supplant any usual component of a standard microcomputer-A/D system is avoided. And the successful mimicking of the ability of traditional chart recorders to perform real-time display and storage of continuous voltage signals will not be truly complete unless the data acquisition software also provides a mechanism for quickly producing a high resolution hard copy record of the collected data as would be done by the traditional paper chart recorder.

SUMMARY OF THE INVENTION

It is an object of the present invention to overcome the above described drawbacks of the prior art.

In accordance with a first aspect of the invention, a first sampled data stream which is produced by a first data sampling means of a data acquisition system is again sampled by a second data sampling means at an adjustable rate to thereby produce a second sampled data stream having a sample point flow rate (number of samples transferred per second) less than or equal to the sample point flow rate of the first sampled data stream. The second sampled data stream is preferably coupled at the very time of its production to a plot display means such as a computer-driven video monitor or a printer for immediate display of its waveshape.

The sampling rate of the second sampling means is set in accordance with a predefined but variable "display time ratio" so that either all or only a fraction (i.e., 1 out of every n original ones) of the individual data values (sample point values) appearing in the first stream will be present in the second stream. When the display time ratio (DTR) is equal to unity, each sample value of the first sampled data stream is passed through the second sampling means to the second data stream for conversion into a plot compatible format and display on the display means. As the display time ratio is increased above unity, more and more pieces of data in the first stream are "skipped" over and a smaller percentage (i.e., 1 out of n) of the sample values in the first sampled data stream appears in the second sampled data stream. Accordingly, the throughput rate of the second sampling means (number of sample values passed per second) is reduced. When necessary, the latter rate may be reduced substantially below (i.e., 10 or 100 times below) the throughput rate of the first sampling means. And as such, the data flow rate of the second sampled stream may be adjusted by orders of magnitude if necessary to reach a level which is less than or equal to the maximum data-flow receiving rate of a pre-selected plot display means. When this is done, the maximum data-flow receiving rate of the plot display means (e.g., computer-driven video monitor or hard copy printer) is no longer acting as a restriction to the maximum data-flow rate of the overall data sampling, digitizing and storage functions of the system and real time display of data waveshapes may take place while the digitizing and storage subsystems are operating at their peak speeds.

While in some situations, the displayed plot of values in the second stream will not provide a completely accurate representation of the incoming sampled data of the first stream, it will be appreciated that some graphic representation of the incoming data is better than none. If desired, combining means may be provided in conjunction with the second sampling means for averaging or otherwise combining (i.e., creating a weighted average which accentuates the maximum, minimum or middle positioned one of) the values of a plurality of sequential sample points in the first stream (each plurality belonging, of course, to one channel) and producing, in place thereof, a single average (or otherwise combined) sample point in the second stream which is representative of the combined plurality of points in the first stream. Each combined sample point of the second stream provides information about all the first stream sample points it replaces, and as such, when the second stream point is displayed as part of a plot, information within the original (first) stream of sample values is not skipped over but is rather incorporated by averaging or other combination into the displayed sample point plot. The display paradigm of the latter approach is "1 for every n" representation rather than the "1 out of every n" representation paradigm provided by the earlier disclosed "skipping" approach. Thus, if there is a singularity within the first stream, its occurrence will not be obscured completely in a "1 for every n" type of representative plot. It will be understood in counterbalance, of course, that the computation of an average or other representative single value for a predetermined number, n, of sample values in the first stream (e.g. 1 for every n) will generally consume computer time, and as such, the earlier mentioned approach of simply skipping over a number of values in the first stream and displaying only a sampled fraction of the values (i.e., 1 out of every n) in the first stream is advantageous when the incoming flow rate is relatively high in comparison to the computation speed of the central processing unit (CPU).

In accordance with a second aspect of the invention, an erase/plot bar is provided extending in a columnar direction across the display screen for displaying on a video or other high speed monitor one or more plots of the values supplied from the second sampling means. The erase/plot bar moves from left to right across the display screen preferably in step with the slowest sampled one of a plurality of data channels being sampled by the first sampling means. With each step of the erase/plot bar, a previously plotted column of data points at the right side of the erase/plot bar is erased and a new column of points to the left of the erase/plot bar is plotted. If desired, the erase and rewrite columns of the erase/plot bar can be combined to be one and the same. In such a case, the erase/plot bar has no viewable thickness and is visualized only as a moving front of data change. Old data appears to the right of the moving bar while newer data appears to the left of the moving bar, the most recent data being directly adjacent to the left side of the bar. With this approach, a relatively small number of columns on the display (i.e. as little as 3, 2, or 1) are being changed with each stepping of the erase/plot bar. This minimizes the amount of time required for plotting a waveshape as compared to other moving plot schemes wherein the entire image of a waveshape is scrolled either to the left or to the right on the screen and accordingly, the ability of the system to handle high rates of data throughput is enhanced.

In accordance with yet another aspect of the invention, the first sampling means samples data from a plurality of data producing channels and a different color (i.e., green, blue, magenta) is assigned to the data of each channel for easy identification. The plotted points of each channel are colored accordingly on the display means to both facilitate correlation with other similarly colored information appearing on the screen (information which is to be associated with the channel) and to enable visual separation of first colored information from differently colored second information on the screen. Multiple waveforms each of a different color can overlap one another without creating confusion. The user is preferably given the option of assigning a different sampling rate and/or different display time ratio (DTR) to each channel at different times during the acquisition (or replay) process so that plot length can be compressed (minimized) when slow changing segments of data appear and the plotting of fast changing segments can be expanded over greater lengths of screen (or paper) for better resolution relative to time when so desired. Color coded text is preferably displayed with each plot and this text is used to relate non-graphic information about characteristics of a respectively colored plot to the viewer such as its sampling rate, the value of a "guideline" (e.g. a threshold line) displayed conjunctively on the screen or the input voltage value of a plotted point. Colored "guidelines" are optionally drawn across the screen to help the viewer identify a plot which is approaching or crossing a predefined level.

It has been found that users easily learn to link colored text material with like colored graphic material while filtering out other display matter which is not so colored. Accordingly, a great wealth of information (both textual and graphic) respecting the characteristics of a multitude of channels may be displayed at once on a color monitor and visual separation of various data items is provided automatically by color coding. Alternatively, the user is given the option of blocking (suppressing) the display of information belonging to one or more channels. A single glance at the display screen can provide the user, in either case, with easily digestible information about the real time state of the data acquisition process.

For maximum vertical resolution, each displayed waveform should preferably "spread" across the full vertical dimension of the waveform displaying screen. The use of a different color for each waveform allows for full vertical spreading of each of plural waveforms without creating confusion. If the maximum resolution capability of the A/D converter is to be efficiently used, the amplitudes of incoming signals should preferably "spread" in like manner across the full digitizing range of the A/D converter. In accordance with the invention, the user is allowed to adjust the display gain so that the full vertical dimension of the display screen represents the full digitizing range of the A/D converter. If the gain of an A/D channel is set too low such that the full digitizing range of the A/D converter is not being efficiently covered by the amplitude of an incoming signal, the user can readily see this from the fact that the displayed waveform fails to span substantially across the full vertical dimension of the display. If the gain of an A/D channel is set too high and/or the offset is incorrectly set so that the incoming signal has levels above and/or below the maximum and minimum digitizing levels of the A/D converter, this too can be easily recognized because part or all of the displayed waveform will be seen to go "off screen". Such an "off screen" condition immediately alerts the user to the fact that data is not being digitized and collected, or worse, that excessive voltages might be present which could damage the A/D converter and/or other parts of the computer system. The user thus has a relatively simple feedback mechanism by which her or she can quickly become aware of problems, and in response, take compensatory action such as adjusting the gain and/or offset of each A/D channel to optimally match the amplitude spread of each incoming signal so that the full capabilities of the data collection hardware are efficiently utilized.

In accordance with a further aspect of the invention, a graphic interface is provided for allowing users to easily select the color coding of each channel, to decide whether the display of any one or more channels should be suppressed, to set a variable sampling rate for each channel, to set the display time ratio of a desired channel, to calibrate voltage levels presented to an A/D converter with physical reference values (expressed in units of the parameters under measure, i.e., force, distance, rate, temperature, etc.) provided by the measurement of equipment, and to assign a descriptive name and physical parameter name to the data received on each channel. This descriptive data (calibration data) is stored in a calibration file and linked with a raw data file holding the collected data so that after the data acquisition process is completed, the raw numbers in the collected data file may be properly identified by the descriptive data in the calibration file. Linkage is made to occur automatically from the outset of data collection so that even after the user's memory of events has faded, mix-ups between the data of different channels and/or experiments will be made unlikely.

Since the collection and permanent recordation of data is often times more important than real time display, a further aspect of the invention is to give top priority to the data storage function and to stop real time display or increase the display time ratio (number of skipped versus number of displayed points) automatically if a contention occurs within the computer between the time and/or hardware resources needed for real time data storage and the time and/or hardware resources needed for real time data display.

A further feature of the invention is a so-called "time-base compression" function. Normally when the sample points of a sampled waveform are plotted, each plotted point is aligned over a unique point on the time line (X axis) and aligned with a value level on the magnitude axis (Y axis). Thus, if a relatively large number such as N=1000 sample points are to be plotted, a correspondingly large number N of 1000 individual time points must be filled along the time line, one for each sample point. If the pixel density of the display medium is such along its X axis that all N time points cannot be shown in a single frame (i.e. on one standard CRT screen or on one standard 8½ by 11 inch sheet of paper), the plot has to broken into fragments. In accordance with the invention, a plurality of plot points are "gathered" over a representative time point and plotted over the representative time point as if the gathered plot points had all simultaneously occurred at the time of the representative time point. This is done in place of plotting each data point over its corresponding and separate time point. Pluralities of gathered sets are printed one after the next over corresponding and sequentially-adjacent representative time points. Each representative time point is representative of the individual time points of its gathered set of sample points (i.e., on a 1 out of n basis or a 1 for n basis). Time base compression takes place because individual time points are skipped over and replaced by a representative time point. This compression does not however skip over data points because a plot point is plotted for each sample point. Thus, if a "spike" or other short duration "glitch" appears in the data, it will not be missed.

Other aspects of the invention will become apparent from the below detailed description of the invention.

BRIEF DESCRIPTION OF THE DRAWINGS

FIGS. 4A-4F illustrate a menu-based user interface system in accordance with the invention.

FIG. 6 illustrates a menu enabling the user to print out a hard copy of a visually pleasing chart.

FIGS. 7D, 7E and 7F are plots showing how the N time points of original data shown in FIG. 7D are compressed by the time-points gathering function of the invention into N/M time lines while still plotting all N of the original data points.

DETAILED DESCRIPTION

The following detailed description includes the best modes presently contemplated by the inventors for carrying out the invention. It is to be understood that this description is merely exemplary of the invention and that it is not to be taken in a limiting sense.

Figure 1:
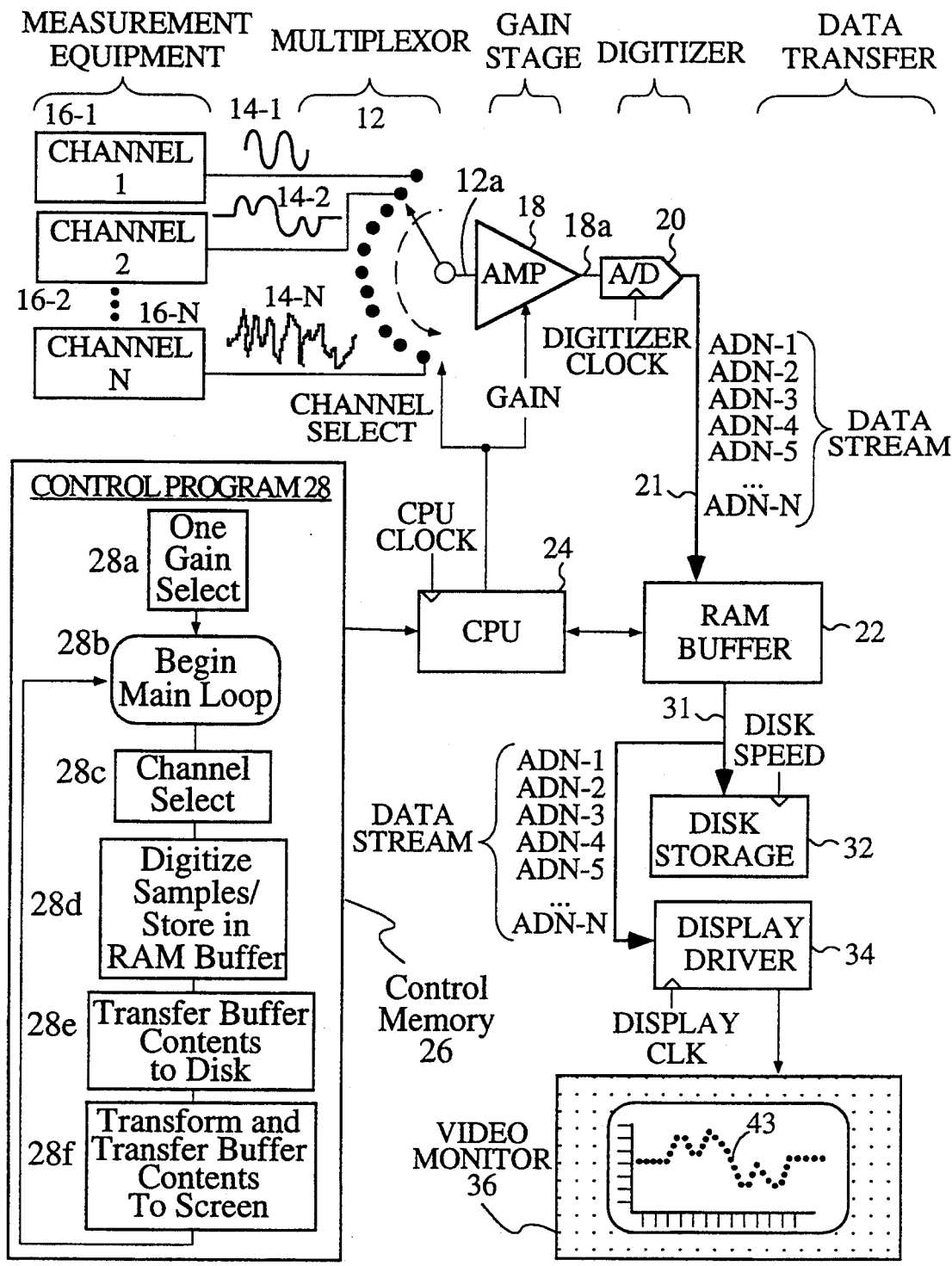
FIG. 1 is a block diagram of a previous multi-channel data collection and display system.

Referring to FIG. 1, there is shown a previous multi-channel data collection and display system 10 which may be implemented as described above using off-the-shelf A/D boards, an IBM PC or compatible microcomputer and available software. In FIG. 1, an N-channel multiplexor 12 samples the signal levels of various signals, 14-1, 14-2, ..., 14-N, supplied from a predetermined number of measurement devices 16-1, 16-2, ..., up to 16-N. An output terminal 12a of the multiplexor 12 is coupled to the input port of an amplifier 18 having an adjustable gain. Analog signal levels generated at an output terminal 18a of the amplifier (as a result of amplification or attenuation) are fed to an analog to digital (A/D) converter unit 20 for digitization. The digitized sample values produced by the A/D unit 20 (denoted as a data stream composed of A/D generated numbers ADN-1, ADN-2, ..., ADN-N) are transferred as digital signals through a first digital data bus 21 to temporary storage in a RAM (Random Access Memory) buffer 22 either by way of direct memory access (DMA) or by passage through an associated central processing unit (CPU) 24. A control memory 26 stores a control program 28 which controls the operations of the CPU 24.

The rate at which the data series, ADN-1, ADN-2, ..., ADN-N is transferred through the first digital data bus 21 is primarily dictated by the maximum rate at which the A/D converter unit 20 can convert analog signal levels into digital values (i.e., maximum frequency of the digitizer clock). Commercially available DMA controllers can easily handle the job of transferring A/D produced data into a standard RAM buffer 22 even when the A/D unit 20 is operating at its peak speed and as such, the DMA operation does not limit the data throughput rate of the overall system 10. For the sake of illustrative simplicity, the DMA block and various control lines associated with it are not shown in the figure.

After sample data ADN-1, ADN-2, ..., ADN-N is temporarily collected in the RAM buffer 22, it is transferred through a second digital data bus 31 (shown conceptually as being separate from but could physically be defined by the same conductors used for the first data bus 21) to a magnetic disk or other storage medium 32 under control of the program 28 directing the operations of the CPU 24.

The data receiving rate (disk speed) of the disk or other storage means 32, like the digitizing rate of the A/D unit, is another primary limitation to the rate at which analog signals can be sampled, digitized and the resultant digital values ADN-1, ADN-2, ..., ADN-N can be permanently stored in the system 10. There is however, a more important limitation to the rate at which analog signals may be processed. This limitation is created in cases where all the sample points stored in the RAM buffer 22 are to be transferred via the CPU 24 to a display driver 34 for display in the form of one or more graphic plots on a video monitor 36. In this case, the raw data values ADN-1, ADN-2, ..., ADN-N that have been produced by the A/D unit 20 and stored in the RAM buffer 22 usually need to be transformed into a display-compatible format before being transmitted to the display driver 34. Typically, the CPU 24 is charged with the job of converting the raw A/D produced data into video-buffer address values which correspond to associated x and y coordinates on the video monitor 36. The coordinates define the locations of plot points (pixels) which are used to create one or more waveform plots 43 on the monitor 36. As will be appreciated, such a conversion process may require substantial time for each piece of raw sample data that is to be converted. And it is here that a critical bottleneck is formed to limit the rate at which the overall system 10 can both plot and permanently store data in real time.

Referring to the flow chart of the control program 28 shown in FIG. 1, a cyclical routine (main loop) 28b is typically utilized to control the process of digitizing the analog values obtained from preselected ones of the channels 16-1, ... 16-N, the process of transferring the digitized values ADN-1, ADN-2, ..., ADN-N to a buffer 22, and the process of further transferring them from there to disk storage 32 and/or to a display device 36. The cycle time of the loop 28b dictates the rate (i.e., bytes or bits per second) at which large blocks of information (those requiring plural cycles of the main loop) may be transferred to disk storage 32 and to the display driver 34.

It is often desirable to reduce the cycle time of the main loop 28b as much as possible so that higher rates of data flow can be supported. Because of this, the operation of selecting a gain value for the amplifier stage 18 is usually incorporated in a step 28a which takes place before the main loop 28b is entered. Once the main loop is entered, a selection is made of the channels 16-1 ..., 16-N that are to be sampled and the analog signals from these channels are sampled at step 28c. The analog values of the selected channels are then digitized and the produced digital values (raw sample data pieces) are passed through data bus 21 for storage in the RAM buffer 22 at step 28d of the control program.

Before the RAM buffer 22 overflows, its contents must be transferred to disk storage as indicated at step 28e. If simultaneous display of the gathered data is desired, the contents of the RAM buffer 22 must also be transformed from a raw form to a display compatible format before new data is written into the RAM buffer 22 and the transformed data must then be transferred to the display driver 34 as indicated at step 28f. At the end of each cycle of data acquisition, storage and display, control is returned to the top of the main loop 28b for repeated writing into the RAM buffer 22 of new raw data from the A/D converter, transference to disk storage and transformation and transference to the display driver.

It can be appreciated that the last step 28f in the main loop, namely, the transformation of raw data into a plot-generating format which is compatible with the display driver and the transference of such data to the display driver, can consume relatively long portions of CPU operating time. Accordingly, it has been prior practice to completely bypass this last step 28f and collect data in the "blind" when the sampling speed of multiplexor 12 is increased and the cycle time of the main loop 28b is found to be too long to keep up with the increased rate at which new raw data flows from the A/D converter 20 into storage 32.

Referring to the data acquisition system 100 shown in FIG. 2, it will now be explained how real time display of waveforms may be achieved in accordance with the invention. Briefly, the control program (and/or hardware if so desired) is modified such that a representative fraction rather than all of the raw data in the RAM buffer is transformed into a plot-generating and display-compatible form of data prior to being transmitted to a corresponding display driver or printer driver. Since fewer pieces of raw data need to be transformed into display-compatible format, less time is consumed for plotting the corresponding waveforms, the cycle time for acquisition plus display is reduced and higher data throughput rates (e.g. higher sampling rates) may be handled by the data acquisition system.

Figure 2:
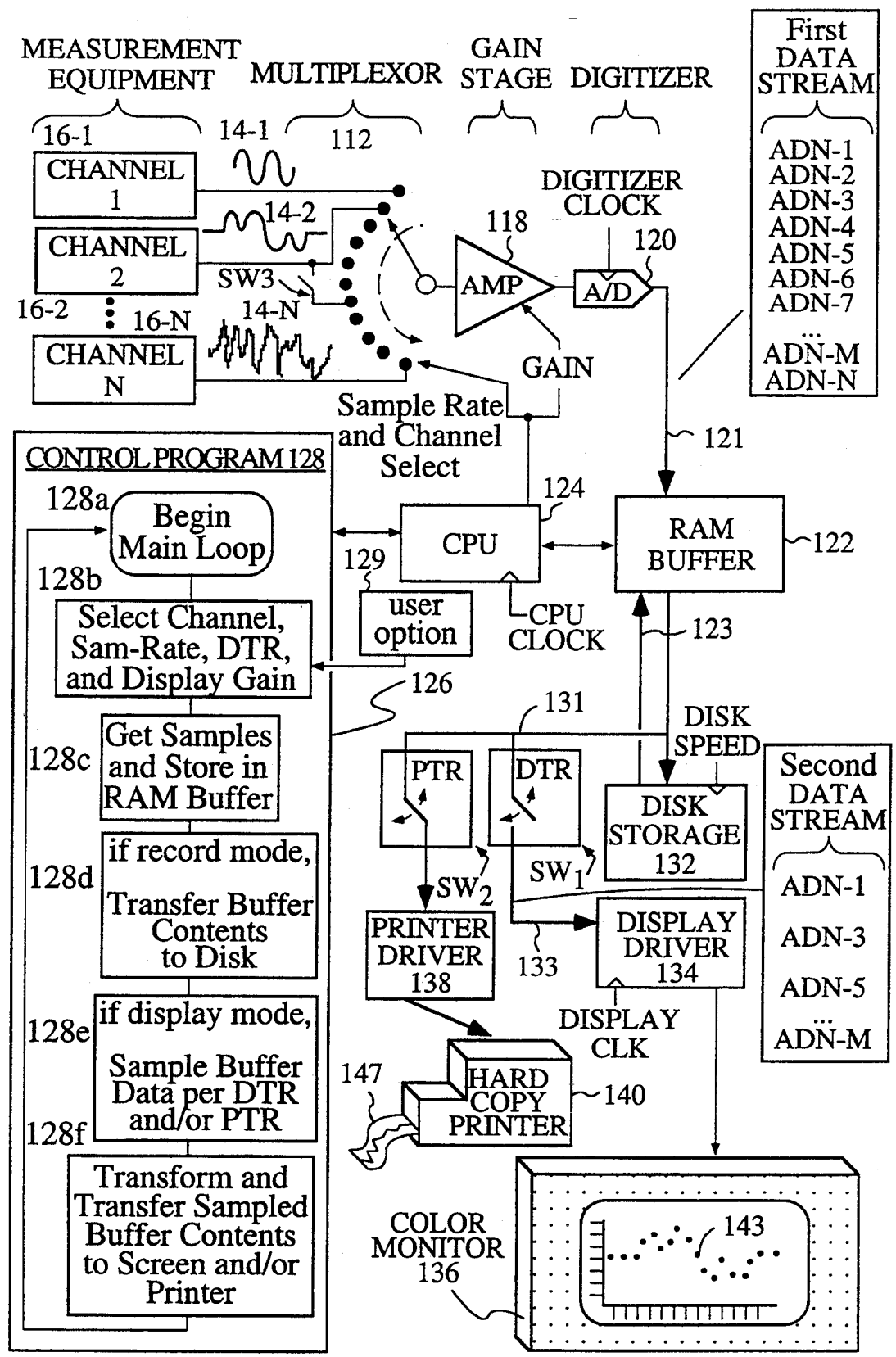
FIG. 2 is a block diagram of a multi-channel data collection and display system in accordance with the invention.

In FIG. 2, like reference numbers are used to denote elements which are generally similar to the previously described elements of FIG. 1. The overall data acquisition system 100 of FIG. 2 comprises a sampling multiplexor 112 (also referred to as a first sampling means 112), a variable gain amplifier stage 118, an analog to digital converter (A/D) 120, and a RAM buffer 122, coupled one to the next as shown. A central processing unit (CPU) 124 mediates the transfer of data between the A/D converter 120, the RAM buffer 122, disk storage 132, a display driver 134 and/or a printer driver 138 under control of a modified control program 128 stored in control memory 126. The drivers 134 and 138 are respectively coupled to a color video monitor 136 and a hard copy printer 140. For the sake of illustrative clarity, the DMA circuitry which passes data quickly between the A/D unit 120, the buffer 122 and the permanent storage unit 132 is assumed to be incorporated within the RAM buffer block 122 and is thus not individually shown.

A main loop within the program 128 begins at step 128a. At step 128b, the CPU 124 outputs control signals to select predetermined ones of the measurement equipment channels 16-1, ..., 16-N; to establish the gain of amplifier 118 for each of the selected channels; to establish a sampling rate at which the multiplexor 112 will periodically sample each of the selected samples and to establish a "display time ratio" (DTR) value and/or a "print time ratio" (PTR) value for each of the channels, which as explained below, determines what representative fraction of the raw data in the RAM buffer 122 if any will be transformed into a display-compatible format for plotting on an appropriate display means (color video monitor 136 or hard copy printer 140). Additionally, a display gain value is established at step 128b to define an amplitude multiplying factor by which the plot amplitude of each waveform will be multiplied in order to adjust its spread in the vertical (columnar) direction of the display means so that maximum vertical resolution across the available surface of the display means may be obtained.

The switch SW$_3$, which is shown coupled to a plurality of input nodes in the multiplexor 112, indicates conceptually how the sampling rate of multiplexor 112 may be varied in step 128b. Essentially, a plurality of equally spaced apart time slots within each cycle time (scan set time) of the multiplexor 112 are assigned to one channel. Some channels are sampled once per scan while others are sampled two or more times per scan thus resulting in a sampling rate higher than that of a once sampled (per scan) channel.

Some of the control parameters (i.e., DTR, sample rate, display gain) established at step 128b may be selected by the user "on-the-fly" as will be explained later when calibration is discussed. A user's option box 129 is shown coupled to step 128b to indicate that the user has the option of adjusting the 128b parameters on-the-fly (during run-time) as the computer 124 is cycling through the main loop 128a. The user has the option of selecting an initial DTR value, but the DTR parameter may be re-adjusted by the CPU 124 in an on-the-fly basis when the CPU 124 determines that too much time is being consumed by the soon-to-be-described steps, 128e and 128f. In such a case the CPU 124 increments the DTR parameter until there is substantially no lag between the rate at which new data is being deposited into the RAM buffer 122 (over bus 131) and the rate at which representative data is being transferred to the display driver (over bus 133 and/or bus 137).

At step 128c, a predetermined number of sample points representing respective magnitudes of the signals 14-1, ..., 14-N on the selected channels 16-1, ..., 16-N are acquired by suitable operation of the multiplexor 112, amplified by the gain stage 118 in accordance with a gain factor specified for each of the channels, digitized through the A/D converter 120 (to thereby form corresponding raw data pieces) and temporarily stored in the RAM buffer 122.

At step 128d, the raw data pieces generated by the A/D converter 120 and stored in the RAM buffer 122 are transferred to disk storage 132 (i.e. by a high speed DMA process) before new raw data pieces are transmitted from the A/D converter to overwrite the locations of the previously stored raw data pieces.

At step 128e, the display time ratio (DTR) and/or a corresponding print time ratio (PTR) which have been previously established at step 128b are used to define one or more secondary sampling functions whereby representative fractions (e.g., 1 out of every n) of the raw data values (pieces) stored in the RAM buffer 122 will be selected for transformation into video or printer compatible plot format and for respective transmittal to a preselected display means.

The selection of representative raw data and skipping over of the other raw data which occurs at program step 128e may be viewed as a second sampling of the data originally sampled by the sampling multiplexor 112 (first sampling means 112). The secondary sampling is conceptually indicated in FIG. 2 by respective first and second sampling switches SW$_1$ and SW$_2$ whose sampling rates are defined by the respective display and printer time ratios, DTR and PTR. For the sake of example, FIG. 2 shows a one for every two sampling process wherein the first data bus 121 carries a first data stream composed of the digital number series: ADN-1, ADN-2, ADN-3, ADN-4, ADN-5, ADN-6, ADN-7, ..., ADN-M, ADN-N; and wherein a representative second data stream having half as many digital values, namely, ADN-1, ADN-3, ADN-5, ..., ADN-M, is received by the display driver 134 for plotting on the video monitor 136.

Suitable adjustment of the sampling rates (DTR and PTR), allows one to set the data throughput rates of the respective switch output lines 133 and 137 of switches SW$_1$ and SW$_2$ to be equal to or less than the maximum data-receiving flow rates of their corresponding display means (video monitor 136 or hard copy printer 140). The through-put rate limitations of the video display and hard-copy printing subsystems (133, 134, 136 and 137, 138, 140) shown in FIG. 2 are in essence decoupled from the remainder of the system 100 by the data reducing action of the secondary sampling switches, SW$_1$ and SW$_2$ and accordingly, they no longer restrict the flow rate at which data may pass along bus 121 between the A/D unit 120 and the RAM buffer 122 or along bus 131 between the temporary storage (RAM) buffer 122 and the permanent storage (disk) unit 132. The only limitations on system throughput are the maximum data flow rates of the A/D converter 120 and of the permanent (or "archival") storage means 132.

After a fractional portion of the raw data values in the RAM buffer 122 is selected by switches SW$_1$ and SW$_2$ (either hardware-wise or by the software operation of step 128e) and transformed into display compatible format, the transformed data pieces are transferred to respective display drivers 134 and/or 138 for optional display on the video monitor 136 and/or for print out on the hard copy printer 140. A hard-copy printed plot 147 of the PTR sampled data generated on line 137 is shown spewing out either in real time or after the fact (in the playback mode) from the printer 140 of FIG. 2. A video displayed plot 143 of DTR sampled values transmitted through line 133 is shown to be developed on the color video monitor 136. Note that the plot 43 displayed in FIG. 1 has generally the same waveshape as the plot 143 of FIG. 2 but that the video plot 143 of FIG. 2 contains fewer plot points.

When the number of selected raw data pieces is reduced at step 128e (by appropriate adjustment of the DTR and PTR values at step 128b), less and less time is required by step 128f for transforming such raw data pieces into display-compatible data pieces and transferring the same to an appropriate display means. Correspondingly, less and less time is taken by the CPU 124 for cycling through the main loop 128a, and as such, the CPU 124 is able to process higher data flow rates from the A/D converter 120.

The CPU 124 is able to use some of the computation time not consumed by step 128f for optionally performing advanced signal processing functions, such as for example, varying the channel sampling rate of each channel "on-the-fly" at step 128b in accordance with instructions 129 provided by a user of the system 100 or varying the display gain of a channel or even suppressing the display of a plot of one of the channels when requested on the fly by a user (through options input box 129 which could be a set of "action keys" allowing the user to toggle through various options).

The extra time made available to the CPU 124 may also be used for optionally varying the DTR and PTR values so as to insure that permanent archival storage of all raw data produced by the A/D converter 120 takes place. If the CPU 124 determines that most of its time within the main loop has to be devoted to transferring large blocks of data from the RAM buffer 122 to disk storage 132 at step 128d, the CPU 124 automatically adjusts (increments) the DTR and PTR values at step 128b so that less time is consumed in performing steps 128e and 128f. In most instances a balance can be struck between the time needed for transferring raw data to disk storage and the time needed for plotting the selected data points of step 128e on a pre-selected display means. In cases where this is not possible, the plotting function is bypassed and the entirety of available CPU time is devoted to storing raw data on the hard disk 132.

The control program 128 of FIG. 2 can operate under at least two modes, a data recording mode and a data display mode, wherein the at least two modes may be activated or deactivated independently of one another.

Recording may take place without display; display may take place without recording; or display and recording may take place simultaneously. This feature is indicated in FIG. 2 by the conditional precursors: "if record mode," in box 128d and "if display mode," in box 128e.

There is a third mode, not shown in the flow chart of program 128. This third mode operates on a mutually exclusive basis with the record mode. The third mode is the "replay" mode; and when it is invoked, the instruction set of flow chart box 128d is replaced with "if replay mode, Transfer Disk Contents to Buffer". The display mode (step 128e) may be activated or deactivate independently of the replay mode (playback mode) and vice versa. During playback, the A/D sampling instructions of program flow box 128c are bypassed since RAM buffer data is generated from disk 132 instead of from by the A/D unit 120.

It should be noted that in FIG. 2, a return data path 123 is provided to return data from disk storage 132 to the RAM buffer 122. This return data path 123 is used in the "replay" mode of the system 100 to dump raw data from archival storage 132 back to the RAM buffer 122 at a predetermined flow rate which, if desired, could be the same as, higher or lower than the rate at which the raw data was originally transferred from the A/D unit 120 to disk storage 132. The raw data in the RAM buffer 122 is sampled by either or both of the secondary switches $SW_1$ and $SW_2$ during this replay mode so as to reproduce on the video monitor 136 and/or printer 140 one or more waveshape plots either at the same speed as they appeared during real time acquisition or at some other speed (fast or slow motion). Thus, a so-called "instant replay" of recently observed waveshapes may be displayed immediately after acquisition on either of the video monitor 136 or the printer 140 in slow motion, fast motion or at original speed if the user so elects. Moreover, by sampling raw data pieces in the RAM buffer 122 backwards relative to the order in which they were first sequentially stored in the RAM buffer 122, cinematic effects such as "reverse motion" may be obtained.

With the availability of both the forward and reverse replay operations, a user can conveniently search through data stored in the disk storage 132 to find a particular segment of data whose waveshapes appear worthy of further study using the video monitor 136 and to then print-out an eye-pleasing hard-copy plot ("charting") using the printer 140. Bulky printouts of the entire contents of disk storage 132 do not have to be made in order to obtain a hard copy of a desired segment of result data. Consequently, the cost of operating the acquisition system 100 shown in FIG. 2 may be reduced in comparison to systems wherein the entirety of waveforms stored in an archival storage unit have to be plotted out in order to have a hard copy of a desired segment.

The user can additionally utilize such replay options to preview waveshapes before a hard copy is made and to adjust the DTR and/or PTR values for a desired level of time line resolution. The display gain, which controls the display height of the printed and/or displayed waveshapes, may also be adjusted on-the-fly and on a per-channel basis in order to obtain a desired visual effect.

The on-the-fly adjustment feature provided by the embodiment 100 shown in FIG. 2, is created by embedding step 128b within the main loop of the program 128. Control of the on-the-fly adjustable values, i.e., sample rate, per channel display gain, PTR and DTR, is granted to the user while the main loop is being executed so that each of these values may be adjusted "on the fly" using "action keys" of a keyboard (not shown) as provided in the user option box 129. The user is able to adjust these values in real time while data is being dynamically plotted on the video monitor 136. This allows the user to optimize in real time the settings of these values prior to conducting an experiment (so that maximum display resolution can be obtained both with respect to signal magnitude and frequency) before data collection is initiated or to adjust them afterwards in the replaying of the collected raw data of the experiment so as to create a desire visual effect in the hard copy plots.

A further advantage of being able to preview the waveshapes of data stored in the archival storage means 132 comes about when it is desired to transfer the data stored in a first computer to a second computer. Often times the formats of digital data within two different computers are not compatible and a conversion process is required in order to transfer data from one computer to another. If a user wishes to transfer only a small portion of the raw data within a file of the archival storage means 132 to another computer and wishes to minimize the time for converting such data, the preview feature may be used to locate and designate the desired segment of a relatively large data file, and substantial time may be saved by converting and transferring only the desired segment rather than the entirety of the relatively large data file.

Figure 3A:
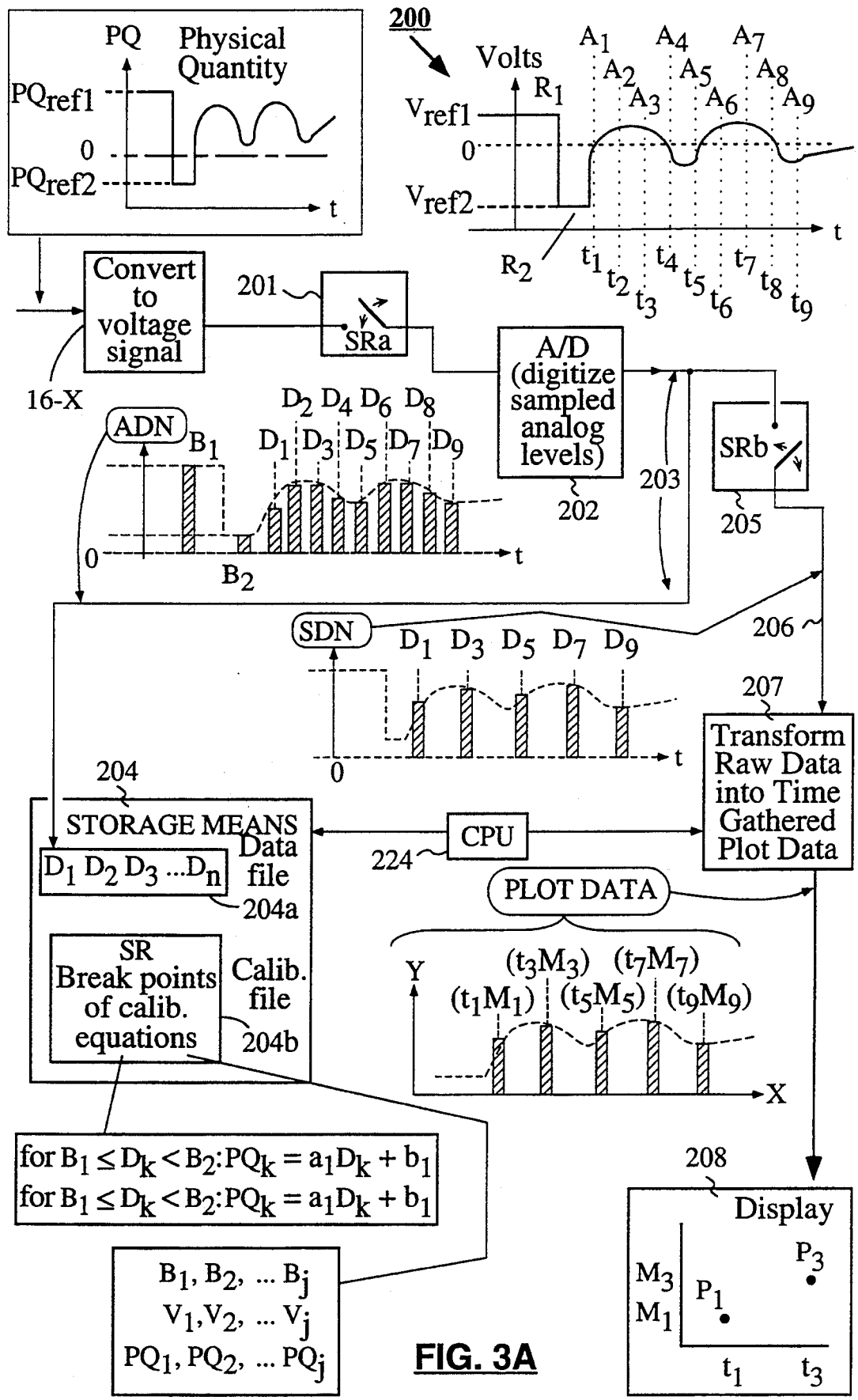
FIG. 3A is a flow diagram showing how information and flow rate transformation (1 out of every n) occurs in a first embodiment of the invention.

FIG. 3A is a flow diagram which explains in another perspective (second embodiment 200) how data is transferred and transformed in accordance with the invention. In FIG. 3A, the data flow of only a single channel is shown as opposed to the multiplexed channel arrangement shown in FIG. 2. It is to be understood that the second embodiment 200 can be implemented with a multi-channel time multiplexed arrangement but that such is not shown for the sake of simplicity. Measurement of a predefined physical quantity (PQ) begins when a piece of measurement equipment 16-x senses the predefined physical quantity (i.e., force, distance, temperature) via an appropriate transducer and converts the physical quantity into a corresponding, time variant, analog voltage signal, V(t). A first sampling means 201 which is operated at a predetermined first sampling rate $SR_a$ selects analog amplitude points $A_1, A_2, \ldots, A_n$ occurring at periodically spaced apart time points $t_1, t_2, \ldots, t_n$ on the real time line and supplies these selected amplitudes $A_1, A_2, \ldots, A_n$ to an A/D converter 202 wherein they are converted into a corresponding set of raw digital numbers $D_1, D_2, \ldots, D_n$ (n being an arbitrarily large integer, i.e., $10^3$ or $10^6$ or larger). The resulting series of raw digital numbers $S_{203} = D_1, \ldots, D_n$ are output sequentially along a first data bus 203 for archival storage in a raw data file 204a contained within a data storing means 204 that is coupled to the first data bus 203. A calibration file 204b, which will be detailed shortly, is operatively associated with the raw data file 204a for supplementing the information stored in the raw data file. Preferably, during high speed collection, only raw data from the A/D unit 202 moves along bus 203 into storage within the raw data file 204a so that the peak storage rates of the storage unit 204 may be taken advantage of.

A second sampling means 205 samples the first stream of data values $D_1, D_2, \ldots, D_m, D_n$ at a second sampling rate $SR_b$ (i.e., a displayable rate) to produce a second stream $S_{206}$ of raw numbers (i.e., only every other number: $D_1, D_3, D_5, \ldots, D_m$) which is output on a second data bus 206. This second stream of raw data i.e. $S_{206} = D_1, D_3, D_5, \ldots, D_m$ is transformed into plot data $P = P_1, P_3, P_5, \ldots, D_m$ by a data transforming means 207. Each plot point $P_i$ output by transforming means 207 is correlated with both a magnitude value $M_i$ and a time value $t_i$ (that is, $P_i = f(M_i, t_i)$). The magnitude and time values, $M_i$ and $t_i$, of each plot point $P_i$ are transformed by the transforming means 207 into an appropriate buffer address for displaying the point $P_i$ at an associated X and Y coordinate on a display means 208.

As mentioned above, in addition to the raw data file 204a, the archival storage means 204 is provided with a calibration file 204b that is operatively associated (linked) with the raw data file 204a. A value representing the sampling rate $SR_a$ of the first sampling means 201 is stored in the calibration file 204b so that the timings ($t_i = t_0 + i/SR_a$) of the raw data pulses can be recreated by combining the raw data values $D_1, D_2, \ldots, D_n$ of the raw data file 204a with the timing information $SR_a$ of the calibration file 204b. Calibration data for transforming the raw data number $D_1, D_2, \ldots, D_n$ of the A/D converter into a series of physical quantity numbers $PQ_1, PQ_2, \ldots, PQ_n$ representing the sampled physical quantity PQ are also stored in the calibration file.

Before a user begins to store raw data numbers in the raw data file 204a, the computer system guides the user through a series of calibration steps wherein two or more reference levels, $PQ_{ref1}$, $PQ_{ref2}$, etc., of the physical quantity PQ under measurement are applied to the measurement instrument 16-x, the corresponding voltage levels $V_{ref1}$, $V_{ref2}$, etc., output by the instrumentation 16-x are sampled by the first sampling means 201, digitized by the A/D unit 202 and respective digitized reference levels are stored as "break points" $B_1 B_2, \ldots, B_j$ within the calibration file 204b together with their corresponding physical quantity reference values $PQ_{ref1}$, $PQ_{ref2}$, etc. The computer can use this information to automatically generate one or more calibration equations having for example, the linear form:

For $B_1 \leq D_k < B_2$: $PQ_k = a_1 D_k + b_1$

For $B_2 \leq D_k < B_3$: $PQ_k = a_2 D_k + b_2 \ldots$ etc.;

where the values $B_i$ define break points and the parameters $a_i$ and $b_i$ define linearization constants for converting by interpolation a raw data value $D_k$ into a corresponding physical quantity value $PQ_k$. Absolute voltage levels, $V_1, V_2, \ldots, V_j$, corresponding to the break points $B_1, B_2, \ldots, B_j$ may also be optionally stored within the calibration file 204b so that the correlations between the physical quantity reference values $PQ_{ref1}$, $PQ_{ref2}$, etc. and the output voltage levels of the measurement equipment can be established. In most instances, an experimenter is not interested in the absolute value of the voltage levels produced by the measurement instrument 16-x, but is instead interested only in the absolute value of the physical quantity PQ that is being sensed by the measurement instrument 16-x. In some cases, however, it is useful to also know the transfer function of the measurement instrument 16-x; and accordingly, the acquisition system 200 of FIG. 3A provides for the storage of these absolute voltage levels together with the reference physical quantities $PQ_{ref1}$, $PQ_{ref2}$, etc. that were used to produce the reference break points $B_1, B_2, \ldots, B_j$.

Referring still to FIG. 3A, the data acquisition, storage and display process will be explained with ancillary reference to the user/computer interface menus shown in FIGS. 4A–4D and the real time display screen shown in FIG. 5A. Before raw data $D_1, \ldots, D_n$ is stored in the data file 204a, it is preferable to first specify a calibration file which gives meaning to the values of the raw data. As shown in the "COLLECT" menu of FIG. 4A, the computer system directs the user to select a "Calibration file" and to associate such a "Calibration file" with the raw "Data file" into which data is to be collected. As seen in the CALIBRATE menu of FIG. 4B, the computer system gives the user the option of adjusting parameters for each channel including the channel sampling rate and the channel A/D gain. The menu (FIG. 4B) further gives the user the ability to create calibration equations for a multitude of calibration break points (using keyboard key activations <ALT1> through <ALT8>, see also FIGS. 4D and 4E). Additionally, the Calibrate menu of FIG. 4B gives the user control over the displaying of parameters such as the display time ratio (<F6>), suppressing the display of selected channels (<F7>) and assigning different colors to different channels (<F8>).

Referring to FIG. 3A, the data file 204a is disabled from storing raw data $D_1, \ldots, D_n$ during the calibration phase. All selections made by the user and correspondingly acquired data are instead stored in the calibration file 204b. To assist the user in the selection of these parameters, the computer system (CPU 224) enables the operation of the real-time display subsystem (elements 205–208) so that the user can visualize for example, the consequences of selecting a particular sampling rate $SR_a$ for the first sampling means 201 and so that the user can establish various "guidelines" (to be described shortly) on the display screen for correlating magnitude levels on the display screen with predetermined levels of a physical quantity PQ.

Referring specifically to FIG. 4C, the user may choose to activate a sequential series of channels (i.e., 1–8), to set a different sampling rate for each of the active channels (i.e., 100 Hz, 200 Hz, and 800 Hz) and to enter a block of text information describing the conditions under which data acquisition is to take place (calibration file note).

Referring to FIG. 4D, the user is further given the option of assigning a specific name to the collected data of each channel (channel title), assigning a physical quantity name (channel type) to the physical quantity PQ under measurement (i.e. VOLTS, POUNDS, HZ, etc.) and selecting the number of calibration equations that are to be used for converting between raw data numbers and physical quantity numbers (select number of calibration break points). As seen in FIG. 4E, for each of the calibration break points, the user can create a calibration equation which transforms a raw digital number (A/D#) or an absolute voltage level (volts input) into the prespecified number of units of the physical quantity under measure. For each reference level, the computer system performs a large number of A/D conversions and then displays the mean A/D raw number generated by the A/D converter, the standard deviation of the A/D produced numbers (SD) and the number of samples taken of the reference physical quantity in order to produce the mean A/D number (i.e., 1867 in the illustrated case).

After a calibration file is created (or a previously created one is chosen), control is returned to the data COLLECT menu (FIG. 4A) and the user is given the option to begin data collection either on a manual cue or upon the occurrence of a predetermined trigger condition (see FIG. 4F). The data file 204a is enabled to begin storing raw data values $D_1, D_2, \ldots, D_n$ when collection is initiated. Simultaneously, the second sampling switch 205 samples the raw data $S_{203} = D_1, \ldots, D_n$ produced by the A/D means 202 at the prespecified display time ratio rate ($SR_b$) to thereby enable the real time plotting of the waveshape of acquired data on the video monitor.

Figure 5A:
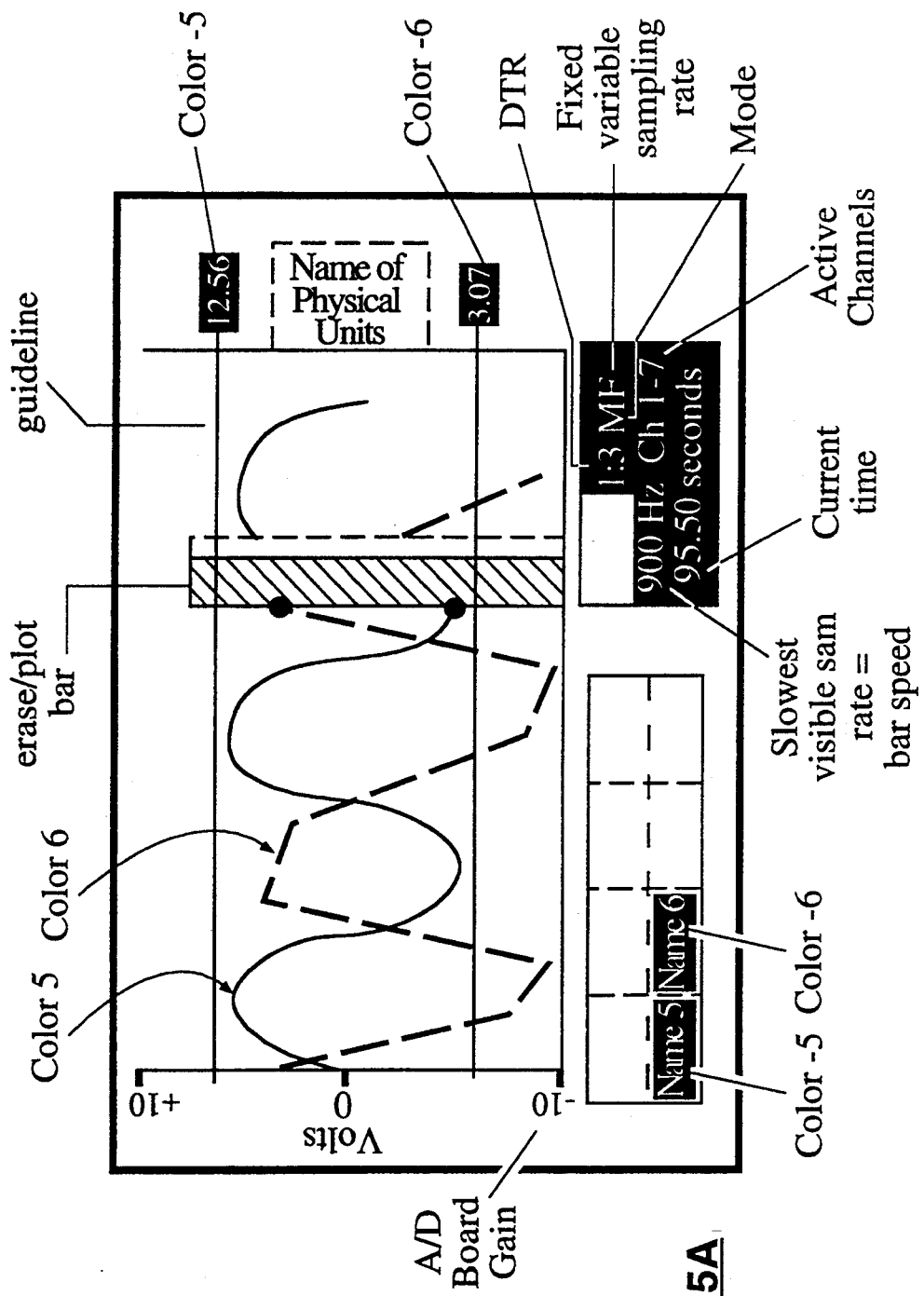
FIG. 5A illustrates a color-coded display format and an erase/plot bar means in accordance with the invention.

Referring to FIG. 5A, the format of a typical display screen in accordance with the invention is shown. The minimum and maximum levels of absolute voltage measurable by the A/D converter are shown on the left vertical axis to indicate to the user what A/D board gain has been selected. The length of the left-side vertical axis represents the full digitizing range of the A/D converter given the selected A/D gain value. Measurement levels in units of a preselected physical quantity under measure are shown along the right side axis. A different color may be assigned to each channel (i.e., color-5 for channel-5, color-6 for channel-6) so that their plots and physical quantity values can be distinguished one from the other on the basis of color cue.

Figure 5B:
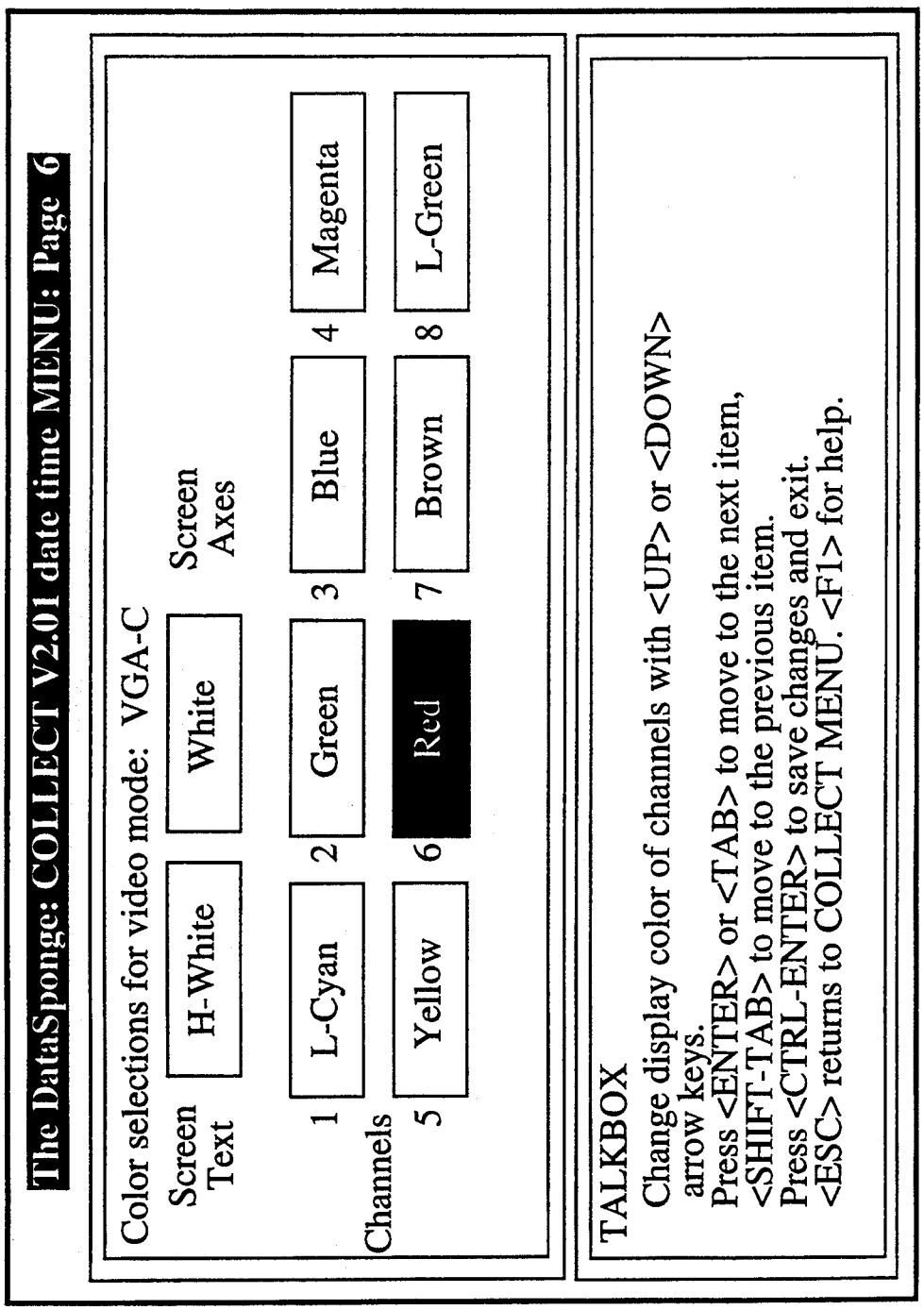
FIGS. 5B and 5C respectively show menus for selecting the colors of the screen in FIG. 5A and for suppressing the display of selected channels.

FIG. 5B shows the color selection menu through which colors are assigned to each of the channels. The number of available colors is made to change as a function of the color pallette capabilities of the attached video display board (i.e., VGA, EGA or some other standard). Note that the same $4\times2$ matrix of channel boxes is shown in FIG. 5C and in FIG. 5A and 5B so that the user can learn to associate box location with a specific channel number.

An erase/plot bar is made to scan from left to right across the display screen of FIG. 5A. New plot points are created at the left side of the erase/plot bar and old plot points are erased at the right side of the erase/plot bar. With this strategy, a relatively small number of display columns are made to change on the display screen with each stepping of the erase/plot bar and accordingly, the time needed by a computer to alter the display screen with each stepping of the bar is minimized.

Figure 5C:
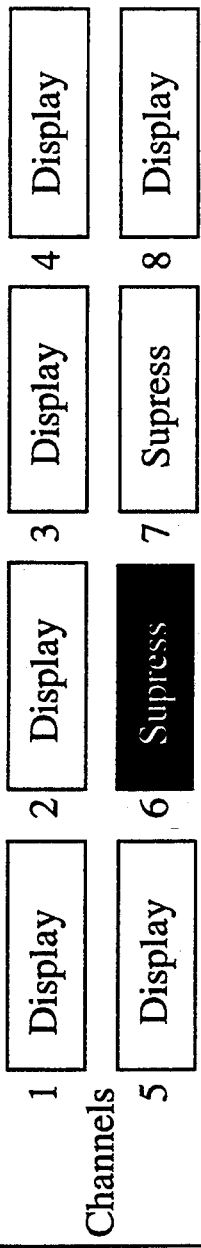

Aside from showing the plot of each waveform in a corresponding color, the display screen of FIG. 5A shows the assigned name of each channel whose waveform is being plotted in its color and in a matrix box that is positioned the same way as the boxes of the selection matrices ($4\times2$) shown in FIGS. 5B and 5C. A menu for suppressing the plot display of certain channels and allowing a display plot for other channels is shown in FIG. 5C. The names of channels not being plotted are hidden in the $4\times2$ channel name matrix of FIG. 5A.

The display of FIG. 5A further provides the user with the name of the data file into which the data is being stored (i.e., FRESH.DAT), the display time ratio being used for plotting the waveforms (i.e., 1:3), an indication of whether collection has been initiated or will be stopped either by manual control or by program control ("M" or "P"), and an indication of whether the sampling rate (of the first sampling means) is at one fixed value for all channels or variable across the channel spectrum ("F" or "V"). Moreover, the display of FIG. 5A indicates the channel numbers of active channels whose data is being collected (i.e., Ch1-7) and the slowest one of the sampling rates used for collecting any of the signals whose waveforms are being displayed. The erase/plot bar is stepped from left to right one column at a time in accordance with time increments equal or proportional to the inverse of the slowest sampling rate on display. The actual time which has elapsed since the beginning of collection, which is also the time point of the latest pixels being plotted by the erase/plot bar is also shown in a dynamically updated fashion (i.e., 95.50 Seconds) on the screen. Thus, with a single glance at the display screen of FIG. 5A, a user can easily keep track of how much time the experiment consumes and the user can immediately detect unusual wave shapes, and/or the movement of a specific signal towards or away from a predetermined physical quantity level whose location on the screen is indicated by an appropriately colored "guideline". The user is given the option of dynamically changing the display time ratio (DTR) while viewing the results on screen so that the user can determine the best DTR for creating a desired resolution of graphic imaging. Moreover, by changing the sampling rate of the slowest sampled channel, the user can change the rate at which the erase/plot bar moves across the screen.

Figure 3B:
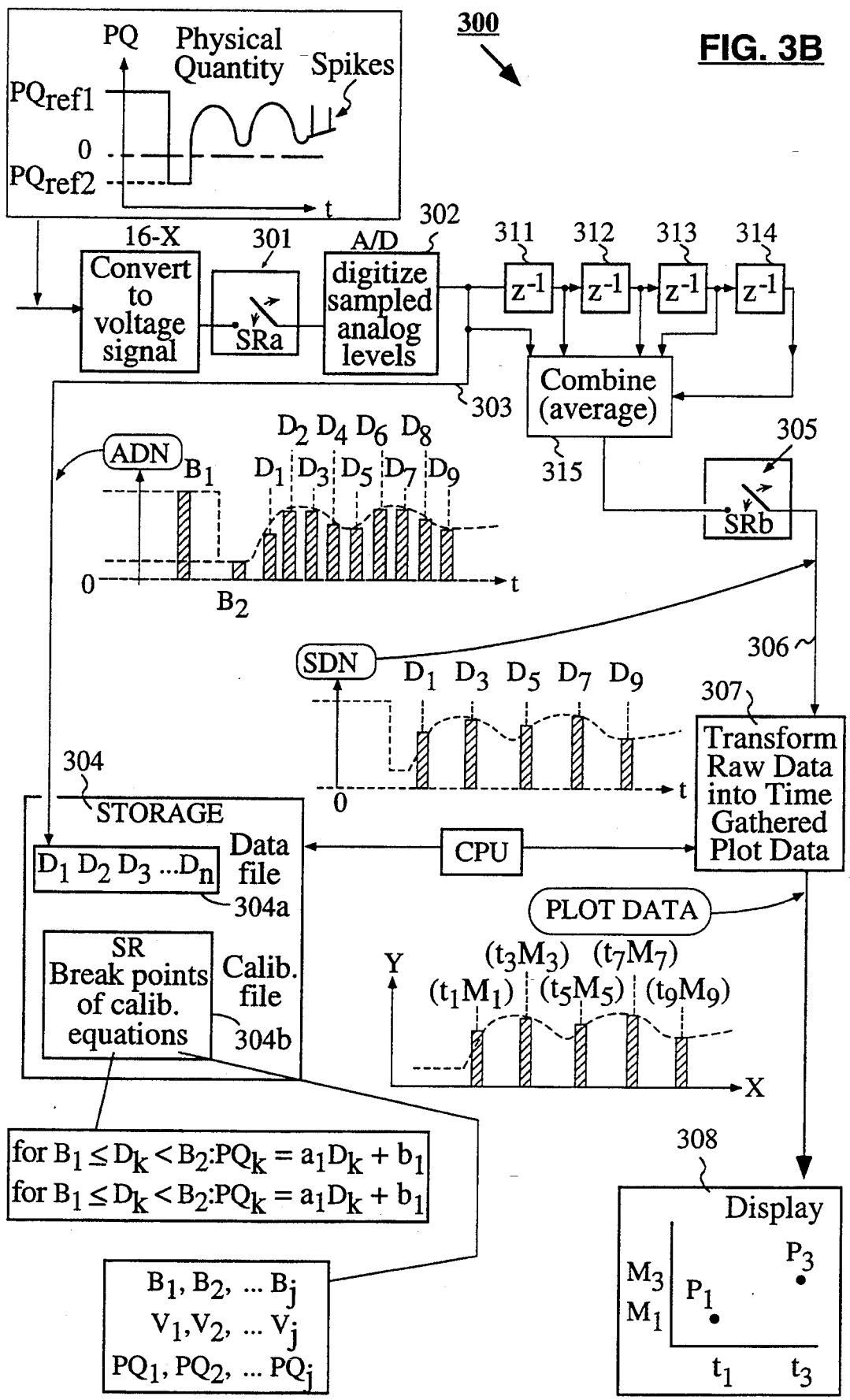
FIG. 3B is a flow diagram showing how information and flow rate transformation (1 for every n) occurs in a second embodiment of the invention.
Figure 7A:
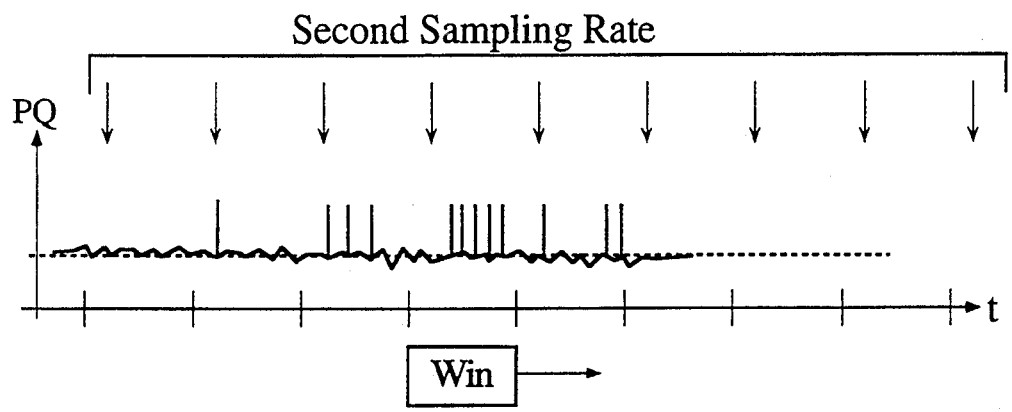
FIGS. 7A, 7B and 7C respectively show plots of actual neurological data (7A), a DTR display of the same using only the skipping function (7B), and a display of the same using a moving average filter for generating representative values (7C).

A third embodiment 300 featuring a "one for every n" representative display capability is shown in FIG. 3B. some instances, it may be undesirable to allow the display to completely skip over a random set of plot points. By way of example, there could be a waveform having very sharp spikes (i.e., glitches) of relatively short durations whose occurrence the user wishes to visually detect even if they occur only once per, say, every one million samples (see FIGS. 7A–7C). In such a case, the configuration of FIG. 3B may be used. Instead of skipping over a predetermined number of sample points, delayed versions of the sample points are combined using an averaging function or some other desired function (i.e., selecting a minimum or maximum value from the predesignated set of points that are to be represented on the display) and sampling the resultant series of combined values at a rate compatible with the data-receiving flow rate of the display means.

Figure 3C:
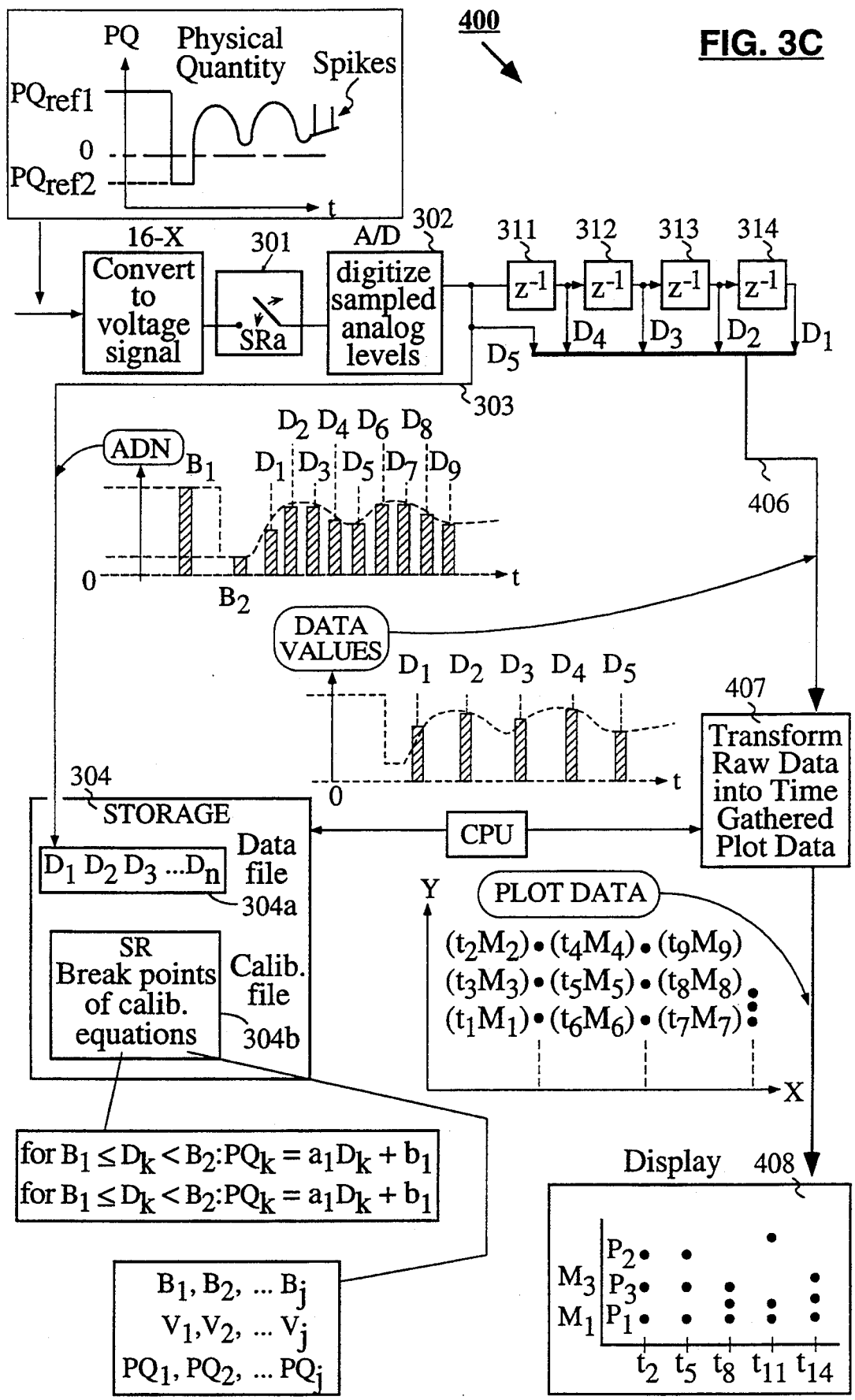
FIG. 3C is a flow diagram showing how data values from adjacent time points are "gathered" and plotted over representative time points to enable detection of glitches or other signal variations.

FIG. 3C illustrates a further method for detecting infrequent data glitches of relatively short duration. The method, which may be referred to as "time-points gathering" or "time base compression" gathers the magnitudes of a plurality of adjacent time points into a gathered set of magnitudes and displays the set of magnitudes over a representative single point line as if they all occurred at the same representative instant of time even though they in fact occurred at other time points adjacent to the representative time point. As shown by way of example in the embodiment 400 of FIG. 3C, data values $D_1$, $D_2$, $D_3$ which are produced by time delay units 314, 313 and 312 respectively are gathered through bus 406 into transforming module 407. Module 407 forms the gathered data set $(D_1, D_2, D_3)$ and links this data set $(D_1, D_2, D_3)$ with a single representative time point, $t_2$ for example, the single time point, $t_2$, being one which roughly indicates the region of original time points $t_1$, $t_2$ and $t_3$. The combination of the representative single time point, i.e. $t_2$, and the multiple values set, $(D_1, D_2, D_3)$, defines a first time-gathered data field. A second time-gathered data field composed for example of the next three data values $(D_4, D_5, D_6)$ and their median time point, $t_5$, is next formed by the time-gathering module 407. The same process is repeated for $t_8$ $(D_7, D_8, D_9)$ and $t_{11}$ $(D_{10}, D_{11}, D_{12})$ and so on. A corresponding number of three plot points, $P_1$, $P_2$ and $P_3$ each having an independent Y coordinate value $M_1$, $M_2$, $M_3$ (representing their respective magnitudes) but the same X coordinate (representing the representative or median time point $t_2$) is generated by module 407 for the first gathered set $t_2$ ($D_1$, $D_2$, $D_3$) and this plot point data ($P_1$, $P_2$, $P_3$) is sent to display unit 408 for displaying along a median time line $t'_2$. Because it takes time to display each of the N data points, even if each is displayed over a representative time point rather than over its individual time point, the display unit 408 is usually a hard copy printer which displays the time gathered data after collection rather than in real-time during collection. Glitches are detected by finding a plotted data point $P_i$ which is substantially separated or otherwise varied from other data points of its gathered set. In the illustrated example, such a variance is seen over representative time point $t'_{11}$. The user can investigate the waveform of the glitch point $P_i$ by zooming in on the time region of the representative time point $t_i$ over which point $P_i$ is gathered. If for example, an unusual variance (not shown) were to be noted along median time line $t'_{20}$, the user would replay the data of associated region $t_{19}$, $t_{20}$, $t_{21}$, (with or without the time gathering function) in expanded form to more fully investigate the time zone of the variance. Preferably all collected data points $D_1$, $D_2$, $D_3$ ... $D_N$ are displayed within such a time-points gathering mode so that every glitch point is plotted. If desired, however, the time-point skipping and/or averaging over-time techniques of FIGS. 3A or 3B can be used in combination with the further time-points gathering technique of FIG. 3C to compress data as desired. One such operation may be compounded on the next in any desired order and any number of times if the experimenter finds such compounding to be useful.

Numerous variations and modifications to the spirit of the invention disclosed here will of course become apparent to those skilled in the art. A software means for practicing the invention is described as an example by the computer program entitled "DataSponge TM" whose source code is disclosed in the accompanying microfiche appendix. This program was developed for use with IBM PC compatible systems operating under the DOS operating system. It should be noted, however, that the invention is not limited only to such software embodiments and that those skilled in the art will be able to apply the teachings of this disclosure to many other different kinds of computer hardware and/or operating system software. It should be apparent that the invention may be implemented entirely in hardware form as well as in the form of a software program operatively driving a standard general purpose computer system. By way of example, the above-mentioned second sampling means may be formed at least in part of a discrete hardware switch rather than being formed by the time shared resources of a CPU which is driven by a data-sampling subroutine.

The DataSponge software package disclosed here (source code listed in Microfiche Appendix A) is able to generate a real-time display of digital data points being sampled from continuous analog voltage signals, even to the highest rates of sampling of contemporary A/D boards. The real-time display capabilities of this software program may be maintained (with appropriate adjustment of the DTR) despite simultaneous transfer of incoming data to permanent storage at the peak data receiving rate of the hard disk or other storage medium. The disclosed DataSponge program achieves this real-time display performance and simultaneous archival storage capability without requiring specialized adjunctive hardware to enhance performance or supplant any usual component of a standard microcomputer-A/D system. And the DataSponge software, in a further application of the Display Time Ratio mechanism, is able to generate a high resolution, hard copy of the plots displayed on the video monitor by using a standard computer laser printer to emulate the hard copy producing function of traditional chart recorders.

A number of distinct modules are included in the DataSponge package: "CALIBRATE" for forming a calibration file that will define the raw data values in a linked data file; "COLLECT" for storing and displaying in real time data acquired by the system; "REPLAY" for reproducing data earlier stored on disk; "CHART" for producing eye-pleasing hard copies and "CONVERT" for converting data for use by computer systems having different data presentation formats.

The DataSponge:COLLECT subroutine makes it possible to receive and sample continuous voltage signals on each channel of a standard A/D board, while simultaneously, digital samples representing 1 out of n (or 1 for n) of the incoming signal values are plotted to screen. By allowing the function of the DisplayTime Ratio to vary, this real-time nature of the representation of the signal may be defended so that the screen plot will not substantially lag behind the digitization function regardless of an increasing rapidity in the sampling rate of the A/D board even to the maximum rate of sampling of contemporary A/D boards, and despite the fixed performance limitations of the video graphics adaptors and/or monitors.

By way of example, the highest rate of A/D sampling presently available from a standard A/D board for an IBM AT style bus is 130 kHz when using the Model 2821f-DI board from Data Translation, Inc. on a typical 20 MHz 80386 CPU based microcomputer with EGA or VGA graphics adaptor and monitor. The full 130 kHz samples/sec apportioned as 8 channels will be sampled at 15,250 samples/sec/channel and this peak flow rate can be displayed in real-time through the DisplayTime Ratio technique. Such a real-time display rate exceeds the maximum potential of any high resolution electro-static paper recorder that is currently available.

The real-time display function of the DataSponge package includes full screen vertical resolution and offers color separation of channels, thus matching and exceeding both the speed and resolution of the paper recorder. In the DataSponge display format, full vertical resolution for all signals is preferably provided. Although plots may overlap they may be easily differentiated by assigning distinguishable colors to each of the channels. This provides striking channel visibility and allows for good resolution with the human eye even from a 10-15 foot distance.

The mechanism for actuating the DisplayTime Ratio is automatic; the rate of display of incoming data points may be varied by the DataSponge software without prompting from the user. Because of this, a real-time display which is useful to the human operator (user) can be produced despite the simultaneous occurrence of high speed transfer of incoming data to permanent storage on the hard disk (digital tape-recording mode). But with this capability of the DataSponge program, there comes another advantage which the traditional paper recorder lacks. Real-time display can be chosen so as to occur alone in an "oscilloscope" mode, without permanent storage (digital tape recording) of the incoming signals. The user is given the advantage of two instruments in one.

In a typical operation using the DataSponge package and a IBM Model 70-121 microcomputer (20 MHz 80386 CPU) containing a standard National Instruments Model MIO-MC-16-H-9 A/D board, a user can choose to sample from among 8 incoming signals at 12,000 samples/second/channel which is the maximum 96 kHz A/D throughput of the board, and to simultaneously visualize the signals in real-time, and optionally also store permanently to hard disk all 96 kHz worth of incoming digital samples without losing the real-time display if so desired.

An extension of the DisplayTime Ratio mechanism is employed in the DataSponge program:CALIBRATE. A single incoming signal can be viewed in real-time and sampled, then assigned a corresponding physical value expressed in terms of chosen units of physical measurement which are appropriate to the instrument generating the signal. By this application of the real-time screen display of the sampled signal, the traditional process of "calibrating" the electrical output signal of a measuring instrument to a set of standard reference measurements of the physical parameter (i.e. blood pressure, heart rate, force, distance, etc.) achieved and stored for future reference using an off-the-shelf microcomputer and standard A/D board rather than by the traditional calibration protocol of using a paper recorder and of hand marking the plots of each reference sample so as to correlate it with a level of input voltage and a physical quantity reference level.

With the DisplayTime Ratio mechanism, the DataSponge REPLAY software module provides the capability of sophisticated "real-time" review (replay) of previously stored digital data. The signal can be visualized again, after being recorded, with the exact timing of each data point indicated so that it appears as a faithful, continuous and dynamic replay of the original signal. The DisplayTime Ratio helps to ensure that a correct time base will be generated for stored digital data being reviewed on screen in the same way that it assures that fresh, incoming data samples are shown in real-time. Once it is known that a displayed point represents the $n^{th}$ one of a series of points originally generated at a known first sampling rate ($SR_a$), it is simple to derive the time coordinate of the displayed point. And if a particular ("fixed") value for the DisplayTime Ratio is selected deliberately by the operator during replay, a long duration of pre-stored digital data can be "compressed" for rapid on screen viewing so that monotonous portions can be isolated in one glance from dynamic ones, or the display view can be "expanded" beyond the rate originally sampled and displayed at high rates of sampling so that it can be replayed point-by-point as if in slow motion.

At any setting of the DisplayTime Ratio, the display screen can be held or paused for leisurely examination; any compressed or expanded time segment of the signal may be frozen for review. By this application of the DisplayTime Ratio to the replaying of pre-stored data files, a variety of time dependent special cinematic effects usually associated with a video cassette recorder (VCR) and video data can be achieved. Using the microcomputer file control features, one can realize an instant playback of the A/D generated samples, including the effects of moving forward or backward in time as provided by the "fast forward" and "rewind" features on a VCR, or the effect of showing rapidly sampled data at rates slower than real-time display much like a "slow motion" VCR effect.

Finally, there is provided a DataSponge: CHART module which utilizes the DisplayTime Ratio to provide a printed paper output (hard-copy) of stored digital data with features and characteristics suggestive of an electrostatic paper recorder device. By using DisplayTime Ratio feature, a standard laser printer capable only of printing page-by-page at a fixed paper-feed rate, can be made to output a single complete page of all collected data and thus emulate the continuous-strip output of the paper chart recorder machinery in which different writing speeds are employed with different speeds of paper feed to produce waveforms having "compressed" and "expanded" sections. As with the DataSponge screen display, a signal which was originally sampled at high frequency such that it would occupy numerous pages if every point were plotted can now be reduced (compressed) to fit on a single printed page. This produces an apparent compression which mimics the effect of the paper recorder being run at slow paper feed speeds despite the high frequency of incoming signals. All the standard paper recorder page features e.g. adding axes, grids, and labels, are available when printing a chart with the DataSponge. (FIG. 6 shows a chart selection menu.) But unlike the paper recorder, a signal which is being sampled at a typical computer A/D board maximum sampling rate e.g. 50–130 kHz can be simultaneously or afterwards printed to paper by using a preselected DTR thereby greatly exceeding the 5–8 kHz maximum frequency response limit of the most capable paper recorders.

In addition to data compression using the DTR technique, the CHART module also allows users to select the time-base compression (time-points gathering) technique. Like DTR, this latter technique allows data to appear across a single screen frame while covering relatively long time spans but data points are not skipped over. Instead they are bunched or "gathered" over representative time points. Different visual effects may be produced by varying the bunch size of each gathered set and the time spread between representative time points.

DETAILED DESCRIPTION OF THE APPENDIX A PROGRAM

As explained above, a key element of the DataSponge package is the DisplayTime Ratio feature, which enables a computer running under the DataSponge program to display incoming digital data in real-time. The first major expression of the DisplayTime Ratio in the DataSponge program set is in the DataSponge: COLLECT routine. The COLLECT program module directs the acquisition of digital data sampled from analog signals received at the A/D board, ensures the real-time display, and optionally stores all incoming A/D samples permanently to disk during the ongoing display.

Some of the terminology used within the DataSponge: COLLECT module is as follows: A Scan Set is a "sweep set" of digital data points consisting of a single A/D number (raw digital data) produced by the A/D board from each channel being actively sampled. For example, if channels 2 through 6 are being sampled, then five time slots are assigned to the one or more the A/D boards in current use, one A/D number is generated in turn from the analog voltage appearing on each channel. A single A/D board can service multiple channels by multiplexing utilization of the single analog to digital converter between active channels over time. However, the function of the DisplayTime Ratio is not dependent on the availability of such a multiplex-capable type of A/D board; a scan set can be formed of any set of A/D numbers or digital points representing the activity of a set of voltage signals at a particular instant. The source of the numbers can be any digital number generating device, even a disk or tape on which numbers have been previously stored.

The operations of a DataSponge-driven computer which feature the DisplayTime Ratio mechanism are controlled by programs having algorithmic process of calculating and adjusting a variable which is locally defined within the program as the "DisplayTime Ratio". The variable expressed as the DisplayTime Ratio is made to appear to the program user as the proportion of digital data points which are plotted (1 out of every n) and these selected points are graphically visualized from among the total numbers of digital data samples which are available. In the COLLECT routine, the available data samples arise from the stream of continuously incoming A/D board numbers representing the signal voltages being received.

The DataSponge program operates the A/D boards in a DMA (Direct Memory Access) mode. In DMA mode, the data acquisition boards transfer their data directly to the computer's RAM memory (the DMA data buffer area) without passing through the CPU. This allows a CPU running the DataSponge program to concurrently control other operations while data is being acquired. The COLLECT routine only needs to periodically check how many bytes have been transferred into the DMA buffer in RAM. "Waitbytes" represents the number of bytes of data information gathered between the Display operation of each cycle. The waitbyte calculation is a function of the number of active channels in the Scan set, the word size that constitutes each data point (2 bytes) for current A/D boards), and the DisplayTime Ratio. For example, with a DisplayTime Ratio of 1, the COLLECT routine will wait for 1 scan set of data to arrive, wherein each data piece consists of a two byte word per channel, so the number of waitbytes is therefore equal to the number of channels times two bytes/channel. If 8 channels are active, then waitbytes should equal 16 bytes. This example is based upon a DisplayTime Ratio of 1. As the DisplayTime Ratio increases above unity, the COLLECT program will cause the computer to wait for the accumulation of a number of bytes equal to DisplayTime Ratio times the number of channels times 2 bytes per data point. Thus the program waits for a larger number of waitbytes, (a larger number of acquired bytes) before sampling another scan set for display purposes. However, while the CPU is in a loop waiting for the arrival of a waitbytes number of raw digital data, some amount of digital data will be concurrently received from the A/D board. This amount may be in excess of the target value for Waitbytes. The actual amount of data concurrently received while awaiting for a Waitbytes number of raw data pieces is defined in the program as "plotlag." If the COLLECT routine is keeping pace with the data being acquired, i.e. it is able to continuously assimilate incoming data, then plotlag will be equal to waitbytes. When data starts to arrive into the DMA buffer faster than COLLECT routine can process it, plotlag will begin to record a larger value than Waitbytes. The difference between the plotlag value and the waitbytes target value indicates whether the COLLECT routine is keeping up with the incoming data such that the data is archived and plotted to screen as soon as it arrives. If the COLLECT routine is not "keeping up" with the flow rate of incoming data, then the plotlag value will be seen to constantly rise above waitbytes (as data which has not been plotted accumulates in the buffers) and the DisplayTime Ratio logic will need to revise the DTR so that the plotlag value will approach the waitbytes value (target value) thereby to minimize the time gap between the moment of data acquisition and the time when representative data is plotted on screen.

The DataSponge COLLECT program offers different modes of beginning or terminating data acquisition, either "manually" by keypress, or in a "programmed" fashion. This latter Program Mode allows automatic acquisition to start or stop when certain conditions selected by the user are met. For example, in the program mode, data acquisition may be preset to stand and/or terminate automatically at a predetermined time of day.

Based upon the aforementioned terminology, the operation of the DisplayTime Ratio mechanism as provided within the DataSponge program may be described as follows. (This mechanism is defined by the code segment entitled GETDATA.ASM which is included in microfiche appendix A.) The acquisition process includes the following computer-implemented steps, preferably in the recited order:

1. Calculate the waitbytes value. If DisplayTime Ratio is 0 or 1, then waitbytes is 2 bytes times the number of channels being actively sampled. Else, waitbytes is set to DisplayTime Ratio times 2 bytes times the number of channels being actively sampled. Also, calculate a special value of the DisplayTime Ratio which is employed by the DataSponge program if disk storage operations are enabled. This ensures that when disk storage is started, the display will automatically slow down to no more than 1 refresh per second.
2. Initialize all system variables used to calculate screen position and DMA buffer positioning.
3. Initialize the A/D board to required setup of active channels set and other board settings including board gain, and sampling rate. Initialize DMA subsystem of the computer to prepare to accept the DMA transfer of the impending stream of A/D board data sample numbers.
4. Start A/D board sampling. (Begin main loop formed by steps 5 through 17 and subloop formed by steps 5 through 8:)
5. Check for A/D board errors. If error flag encountered, then stop A/D board operations and report error condition to user.
6. Check if key pressed. If so, then process keystrokes as follows:
   <SPACEBAR> Turn disk storage ON/OFF. If disk storage is disabled, then enable it, and vice versa. Also set the DisplayTime Ratio and waitbytes to the special value calculated at initialization time. At high speeds, COLLECT may be writing multiple data blocks per second to the hard disk, therefore setting the DisplayTime Ratio immediately to a high value allows COLLECT to preserve a "real time" image of the acquired signals from the beginning of disk storage. That is, by immediately decreasing the proportions of incoming points plotted on screen, the remaining ratio of points can be plotted immediately as they are sampled, so the plotted points are shown virtually simultaneously upon arrival, i.e. real-time.

<INSERT> Pressing the INSERT key indicates that the user chooses to actively interact with the DisplayTime Ratio logic to request during program operation that the value of the DisplayTime Ratio be increased by periodic increments of 1 while the key is pressed. Then recalculate waitbytes, and change the DisplayTime Ratio indicator on the screen. The user thus manually overrides the DisplayTime Ratio calculations to deliberately lessen the fraction of incoming data points being shown in real-time.

<ESC> Terminate data acquisition. If disk storage is enabled, write out the current contents of the output buffers to the data file and close the file. Return to the main program.

7. Read the DMA countdown value. The DMA subsystem provides a "residual count" of the number of bytes left to copy to storage. Therefore the number of bytes ready to process is equal to the requested transfer size minus the residual count.

8. Has the current number of waitbytes bytes been acquired yet? If not, then continue COLLECT operations and sampling. That is, continue to acquire data through the A/D board as outlined at step 5 above, i.e. continue repetitively through steps 5 to 8.

When the current number of waitbytes has been acquired, calculate the plotlag and proceed.

9. Check the status of Manual or Program acquisition. Check if a Program Mode start is required. If so, then check if conditions are met to automatically enable disk storage of the A/D data.

10. Check if a Program Mode stop is required. If disk storage is enabled and conditions are met, then automatically stop the disk storage acquisition. The display will still be operational.

11. Service the screen display. Included is an update of the real time counters shown on screen (seconds and centiseconds) according to the number of samples just acquired. (i.e. if all channels are sampled at 100 Hz and 20 samples per channel have been received, then update the clock by 20 centiseconds.)

12. Examine the number of bytes accumulated in the DMA output buffer and write a block to the hard disk file if buffer is full and disk storage is enabled. Note that the preservation of data takes priority, and has been attended to before the DisplayTime Ratio adjustment continues.

13. Plot the first scan set of data received onto the screen. As each channel is displayed on the graphics screen, each point one step to the right is erased creating the appearance of a moving "erasing/plotting bar" as points are drawn from left to right.

14. Consider screen lag, i.e. is there evidence that the points being plotted to screen are not being plotted simultaneously with their arrival, i.e. are they falling back in time from real-time acquisition? Any evidence of screen lag requires a change (increment) in the DisplayTime Ratio.

15a. Ensure that screen lag can be examined; there is one program condition where screen lag is not examined for change, namely if the PLOTLAG flag in the code is turned on ON. If the PLOTLAG flag is set to ON, then screen lag is not examined further and the program continues to acquire data as per step 5 described above. The PLOTLAG flag is set ON by conditions that are certain to cause a temporary screen lag and for which an adjustment of the DisplayTime Ratio should therefore not be calculated. This flag is set when we know that a lag will occur. The best example of this is when a full output buffer is to be written to the file.

15b. If screen lag can be examined, check if the current value of plotlag is greater than its value the last time a scan set was displayed. If plotlag is greater, then also check how many consecutive times this value has increased. If the counter surpasses a preset threshold value for increases in plotlag, then adjust the DisplayTime Ratio in one of two ways: 1) If disk storage is enabled, then increase the DisplayTime Ratio by 50%. This is a logarithmic damping of the DisplayTime Ratio. For example if the current DisplayTime Ratio is 6 then the new value during enabled storage to disk would be 9. 2) If disk storage is not enabled, that is the A/D board is acquiring data samples to the computer DMA without passing them on for archiving in permanent hard disk storage, then simply increase the DisplayTime Ratio by 1. This is a linear damping.

16. After making any necessary alterations in the DisplayTime Ratio, recalculate waitbytes so that the system will process larger data blocks i.e. more incoming data samples and carry less overhead. As waitbytes increases with an increasing DisplayTime Ratio, the system displays a lesser proportion of incoming points and calls other processing routines less often thus reducing the time overhead for each scan set being displayed. This allows the system to process more information, which enables the continued uninterrupted acquisition and transfer of data samples by the A/D board while still ensuring that a proportion of points are written to screen in real-time and optionally saved to disk.

17. Continue with acquisition as per the description in Step 5 to process another incoming scan set.

The manner in which this DisplayTime Ratio function is expressed by the DataSponge program in a real-time display is shown by FIG. 5A (except the erase/plot bar preferably has zero thickness so that the same column that is erased has new data immediately rewritten into it). When the real-time plot display screen replaces the menus and interactive user response windows, it continues to present essential information about the data acquisition task which is underway, as well as displaying the waveshapes of incoming data in real-time. The central area on the display screen remains blank until the display of data is initiated by pressing an appropriate key for activating the display subroutines.

Before data is displayed, and at all times during the display, the COLLECT display screen shows:

1) The name of the raw data file, centered directly under the horizontal axis.
2) Names of the data channels, color coded, in two lines beneath the name of the data file.
3) The conditions of data acquisition and display on three lines beneath the horizontal axis at the right side of the screen. Among the display information are: on line 1, the Display Time Ratio of data points shown/incoming data samples and an 'M' or a 'P' to identify the Mode of data collection, either Program or Manual Mode. Another letter follows, either an 'F' if data is being collected with the same fixed sampling rate on all channels, or 'V' if sampling is occurring across the channels at different speeds. After that a "P" is shown to indicate Program Mode, if the trigger has been activated but acquisition has not yet begun, the letter 'P' is replaced by 'S' for 'stand by'. An "M" indicates manual mode. Also shown is the sampling rate for all channels when gathered at a fixed (F) rate of sampling, or the sampling rate of the slowest sampled one of the data channels when data is being gathered by variable (V) speed sampling. The display further indicates the numbers of the first and last active channels and the current time in seconds of data being displayed.

4) The data axes: Two vertical axes each with a label appear respectively at the left and right extremes of the horizontal axis in the data display area. The left axis corresponds to data values in terms of A/D input voltage; the right axis expresses the data values in units of physical measurement. The left voltage axis indicates the maximum voltage range available with the currently selected A/D board gain.

The right or physical unit axis of the display may indicate high and low guideline values of physical measurement corresponding to each channel. The high and low guideline values displayed to the right of the physical unit axis will be color matched to the data channel titles, the data channel guidelines, and the data points as they are displayed.

The two primary functions of the COLLECT routine, namely, data display and data storage, can operate concurrently or independently.

The function of displaying data can occur without any data samples being stored permanently to disk. Conversely, the storage of data can occur without necessarily viewing any incoming data on screen. Usually, it will be preferred to both watch the incoming data points on screen in real-time, as well as continuously store the data samples permanently to disk. However, if data storage without display is desired, the display may be turned off without interrupting the ongoing data collection and storage to disk.

The two program functions of data display and data storage are described in further detail below. In any such description of the functions and their Action keys, it is important to remember that the two major functions operate independently.

When the data display function is activated, COLLECT shows on screen a continuous record of data which is being sampled from incoming voltage signals on each channel of the A/D board. In FIG. 5A the signals being received and sampled on channels 5 and 6 are shown. The data display is continuous and faithful to the voltage values it represents. The color coded channel title and optional high and low guideline values provide the user with instant recognition of the relative value of the sample points being shown on each channel. The screen display can be instantly STARTed/STOPped by toggling it ON/OFF using the $<+>$ key on the keypad. Using the appropriate Action Keys, the display of individual data channels can be toggled ON/OFF while the data acquisition continues.

The character of the display seen on screen is the result of the Display Time Ratio, an essential feature of the COLLECT module. Unless adjusted to be otherwise, the COLLECT plot of each channel will show each new point in real-time. That is, COLLECT will show only as many of the currently incoming data points as it can display while still keeping up with the continuous incoming flow of samples arriving through the A/D board. At slow sampling rates, COLLECT will show all samples arriving on channels for which the display is active. At high rates of sampling, a representative proportion of data points will be shown to ensure that the points currently seen on screen do not lag behind the incoming data even if the display has a relatively low data-flow receiving rate. This preserves the real time character of the display. By way of illustration, if for the screen shown in FIG. 5A, data is being sampled by the A/D board at 900 samples/second/channel on channels 1-7, but the user has chosen to "turn off" (suppress) the display of all incoming channels except 5 and 6 then only the plots of channels 5 and 6 will be generated. In FIG. 5A, the plots of the two channels are differentiated by a solid versus a dashed line, but when viewed in real life the channels would be differentiated by color. In the illustration, the Display Time Ratio has been reported as "3 to 1" which tells the user that of all the incoming, available data samples on these two channels, every third point is being plotted to screen while the two intervening points are passed over, and not plotted to screen. This display modality does NOT affect the sampling and/or storage of all points arriving, only their display. The one third fraction of points that are being plotted, are being seen real-time. That is, as soon as each third point is acquired it is plotted almost immediately to screen so the user can appreciate the real-time nature of the samples which are being generated by the measurement equipment.

If the user chooses to view a lesser proportion of incoming data points, this can be achieved dynamically during data acquisition by simply incrementing the value shown as the Display Time Ratio, on the fly, using the appropriate Action Key, which is the $<$INSERT$>$ key. If after incrementing the Display Time Ratio, the user decides to revert to the Display Time Ratio which was being automatically calculated by the DataSponge program, this can also be accomplished "on the fly", as data display continues, using the $<$DEL$>$ key. A restriction is that the Display Time Ratio cannot be decremented while data is actually being passed in large blocks for archival storage on disk. When data is gathered using the Variable Speed Sampling option, that is different channels are being sampled at different speeds through a special feature of the DataSponge, the screen display will show all incoming channels at the lowest common sampling speed. That is, if samples from several channels are being gathered at different sampling rates, all channels will be shown on screen at the rate of the channel with the slowest sampling rate.

Regardless of the data display function, the user has control over the storage of incoming data through pressing of the appropriate Action Keys. Data collection and storage can be initiated instantly and stopped instantly with the appropriate manual keypress, without disturbing the real-time display activities of the Display Time Ratio mechanism. Alternatively, with a different keypress, data collection can BEGIN/END in accordance with any triggering options that have been previously selected in Program Mode data collection when constructing a Calibration file utilizing the DataSponge: CALIBRATE module.

The end result of the Display Time Ratio operation for data acquisition with the DataSponge: COLLECT program is a continuous, real-time, multi-channel display of signals being sampled by the A/D board and computer, with a proportion of incoming data points being visualized/omitted according to a computer servo-mechanism created with the Display Time Ratio software while allowing user adjustment of the Display Time Ratio. And this real-time display function is defended regardless of the rate of sampling or of any concurrent responsibility of the computer to archive the raw data that is being acquired.

An associated application of the Display Time Ratio mechanism is to provide a real-time display plot of an incoming reference voltage signal arriving on a particular channel of the A/D board for the purpose of Calibration rather than continuous storage. The Calibration procedure, as usually applied in the life and biological sciences, requires the presentation of a physical quantity of a predefined (standard) size or amount to a measuring instrument. The measurement instrument produces a corresponding output voltage signal. This process is repeated over a range of quantities which are to be measured. Then this standard set of measurements is used for deriving by curve fitting the physical quantity values of additional measurements of items which are of unknown size. Traditionally this process was performed almost intuitively on chart recorders by presenting and recording the voltage response of each instrument as reference lines or curves on the paper chart record.

Using the Display Time Ratio in the DataSponge: CALIBRATE program, a new computer automated process of performing calibration can occur. The incoming signal on a particular channel is calibrated using the A/D board and computer screen. The voltage signal which arises from a measuring instrument in response to a known physical signal is viewed on screen in real-time and the exact signal which is sampled may be visualized and stored for future reference. Each reference voltage value may be assigned to a corresponding value in the units of physical measurement appropriate to the instrument generating the signal. Thus a series of physical to voltage pairs are assembled, a mathematical relationship between them is derived (i.e. a set of linear approximation curves) and one or more calibration equations are inscribed into a calibration file. Because this new form of visual calibration is computer based, it can be made more precise than the traditional recorder calibration process, and it is accomplished under direct vision, in real-time, but with no costly paper being expended.

While the description and operation of the Display Time Ratio above was phrased in the context of the DataSponge: CALIBRATE and COLLECT programs, there is still another advantageous utilization of the real-time display created through the Display Time Ratio. After digital data has been stored permanently to disk files, it is made easily reviewable. Review traditionally took place in the form of "flipping through" old pages of inscribed sheets of paper recorder output, looking for noteworthy data. With the Display Time Ratio mechanism, this after-the-fact review of digital data may be transformed from manual drudgery into a dynamic, re-creation of the original real-time display of the type that was visualized as the data was being stored originally.

The mechanism of the Display Time Ratio feature is essentially unchanged during such review. The mechanistic difference is that the Display Time Ratio process calculates the necessary DTR from the rate at which the stored data was first sampled, the DTR being the rate of writing to screen at which a visual "replay" or "playback" image will be produced so as to correctly reproduce the time base of the original acquisition. Thus, when the stored data is replayed, it can have the exact timing and appearance of data being actively acquired It appears "real time", even in replay; it maintains the motion and timing of any previously viewed action, as if recorded by movie film or video camera for replay on a VCR (video cassette recorder). Even in replay, the operation of the Display Time Ratio mechanism is designed to insure that the display does not lag substantially behind the replay data and that the proportion of data points plotted keeps up in time with the flow of digital replay points. The difference in the application of the Display Time Ratio mechanism within the DataSponge: REPLAY program is that the incoming sample points stream into the computer from their storage on the hard disk rather than originating from the A/D board.

Typically, all data channels will be REPLAYed simultaneously and continuously, in real time, and in different colors. The display occurs with a correct absolute time base, so just as occurs with a VCR replay of an oscilloscope acquired image, a data file can be REPLAYed as if in real-time. The data record can be played back at "normal speed". However, through user intervention with the automatic Display Time Ratio calculation, different visualizations of the digital data can be made possible. The Display Time Ratio presents a tool for choosing what proportion of data points will be visualized or reviewed. This allows an existing data file to be "sampled" for quick review by the manual selection of a proportion of samples to be viewed. Rather than displaying every point in the data file, if every second, tenth or any 'nth' data point is plotted during REPLAY, the effect is of a greater-than-absolute time base to speed through or rapidly review a data file. This has the effect of "compressing" the file of data, and is analogous to the "fast forward" operation of a VCR playback. At any time during playback, the dynamic screen review can be stopped for fixed review, or even dumped to a printer. The screen-by-screen action, moving forward or backward from any point in the data file and displaying any single screen, emulates the "stop action" or "freeze frame" features of a VCR moving "frame-by-frame" through the data.

Finally, the DataSponge: CHART program can be used to skillfully mimic the features of a rapid response, electrostatic, paper recorder or even the traditional side-by-side, "strip chart" format of the old style analog paper recorders. Advanced features such as publication quality channel numbering and identification, adjustable grid markings, independent time scales, overlapping channels, full page resolution and high resolution, are made available to the user by the DataSponge: CHART program.

Using the CHART program, complete contents of a data file can be printed, or for further economy of printing and storage, only selected portions of the data may be printed. After receiving the filenames, CHART can be instructed to begin/end on any time point (elapsed seconds count) of data in the file. Even within sections of the file selected for printing, data points from all active channels need not be printed. From the calibration file, each channel, its guidelines, and the values of the guidelines, can be printed by CHART or omitted. In addition, the entire Calibration file summary and even the pairs of physical calibration points can be printed out with the data record. The stream of data points can be portrayed on the record as individual points (dots) or they can be connected to form a continuous smooth line or curve, and the style of the printed record can separate data from individual channels into discrete, parallel strips on the paper, or more contemporary, free-form, overlapping data channel records. In the style of the latest generation of chart recorders, the background grid is applied to the paper at the time the signal is printed, and is completely adjustable. The full scale range of the signal on the paper can mimic the range of the original A/D board or be suitably scaled to cover the entire charting surface. By the key maneuver of adjusting the proportion of data points from the file which are printed by CHART using the Display Time Ratio, and fine tuning the amount of "white space" between adjacent printed data points, the precision and density shown across the printed record can be controlled. This latter process produces an effect similar to adjusting the paper writing speed on a paper chart recorder. This gives a record printed by DataSponge: CHART the appearance of a record that seems to have been printed at different paper feed speeds, despite its production on a conventional laser printer that inscribes single whole pages at fixed paper feed rate.

Although in appearance, a DataSponge: CHART produced record emulates the paper recorder, when it comes to frequency response, the CHART performance eclipses the paper recorder. The maximum frequency response of the DataSponge: CHART program is determined from the outset of acquisition by the maximum throughput rate of the microcomputer-A/D board system.

Figure 7B:
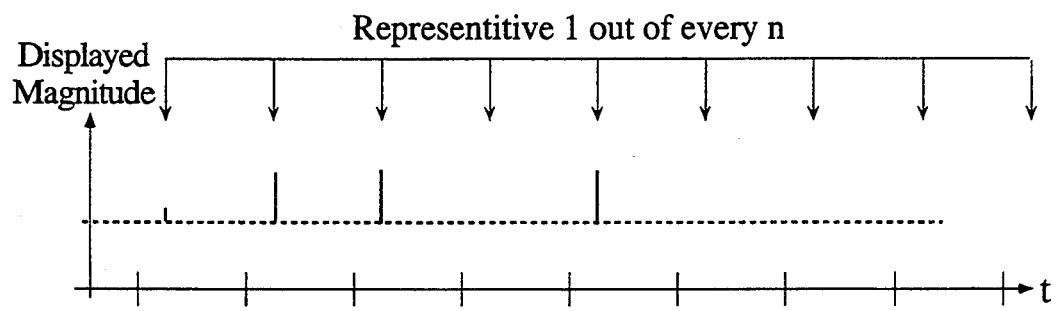
Figure 7C:
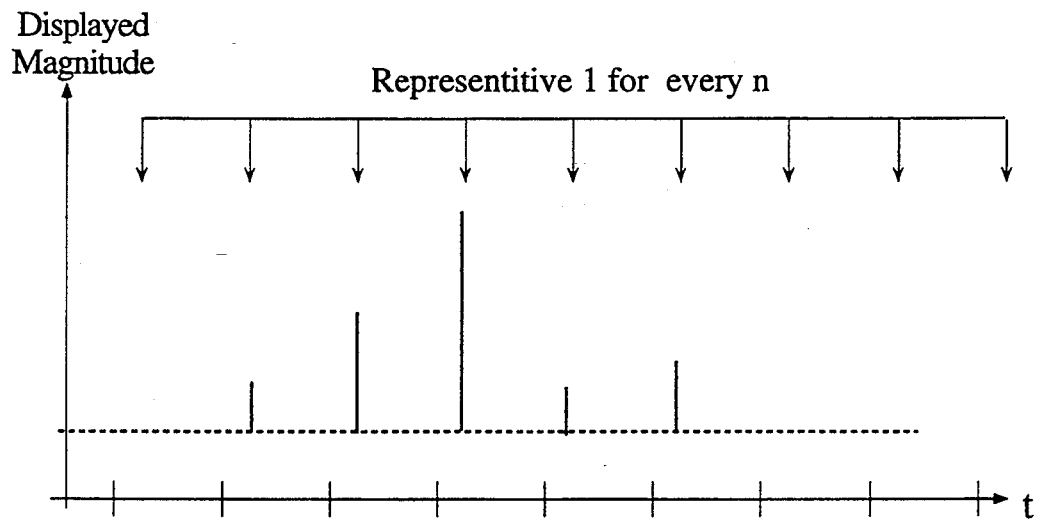

The selection of certain options characterize the appearance and format of the CHART output. After choosing the start and stop time points of data within the file, the user is given freedom to specify the particular data channels to be printed, the trace type (i.e. arranging individual channels as horizontal, parallel "strips", superimposing channel traces to give each full page resolution exactly as the voltage signals arrived at the A/D board, or offsetting the channel signals across the page width), the grid size, scaling amplitude, print display factor (PTR), white space points, and printer resolution. All these will determine the appearance of the final CHART output. By way of example, two signals were sampled by an A/D board and stored at 20 kHz samples per second on each of two channels and the stored data was then CHARTed. Exceeding the apparent recording frequency of any conventional paper recorder device, these signals could have been plotted out point-by-point for reproducing fully the 20 kHz sample frequency. Instead, the Display Time Ratio (in this module entitled the Print Display Factor) was used to simulate a more rapid writing speed, to visually compress the data. Printing on a laser printer at the maximum resolution of 300 dpi, approximately 8 seconds of data sampled at 20,000 samples/second was compressed into one page for easy reference. This was accomplished by using a Display Time Ratio of 50, the print equivalent of a Display Time Ratio of 50:1, and about seven full seconds of data was isolated per printed page. Both data channels are printed in two strip mode as shown in FIG. 7b and 7c respectively. A fine 5×5 mm grid is placed as a background and the amplitude is left unscaled consistent with the voltage which was received and digitized by the A/D board. When the pair of records 7b and 7c are compared, it is apparent that the two printouts accentuate different aspects of the same data. In FIG. 7b, only every 50th point is printed, exactly like the effect of the Display Time Ratio during monitor display. However, in FIG. 7c, data "smoothing" is added to the Display Time Ratio process. Here the smoothing is a rudimentary type of digital "filter", a simple moving average stretched over each consecutive sequence of 30 digital data points. Thus the influence of points omitted because of the Display Time Ratio of 50 still influence the remaining printed points.

Figure 7D:
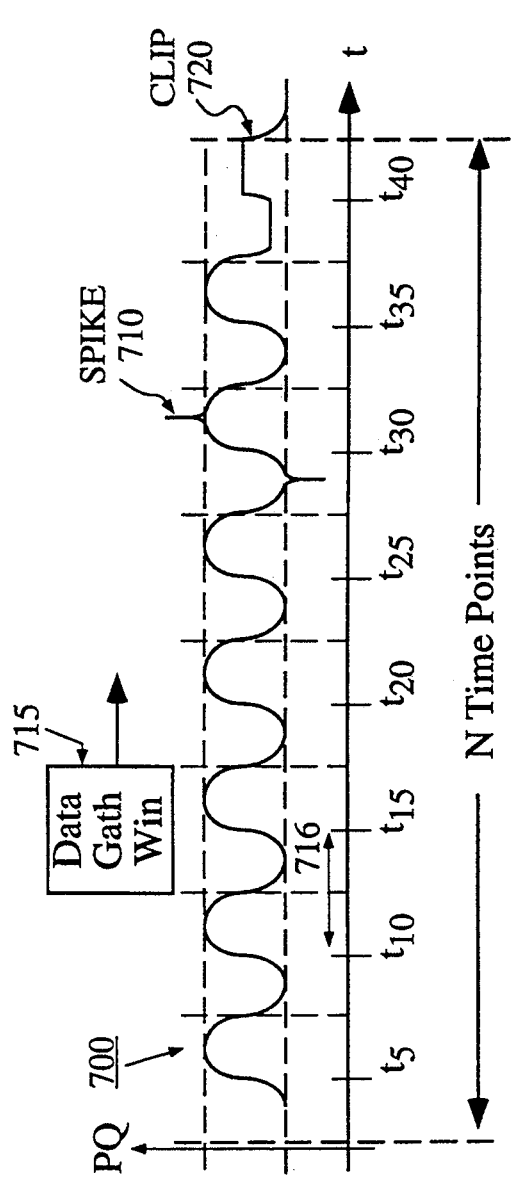
Figure 7E:
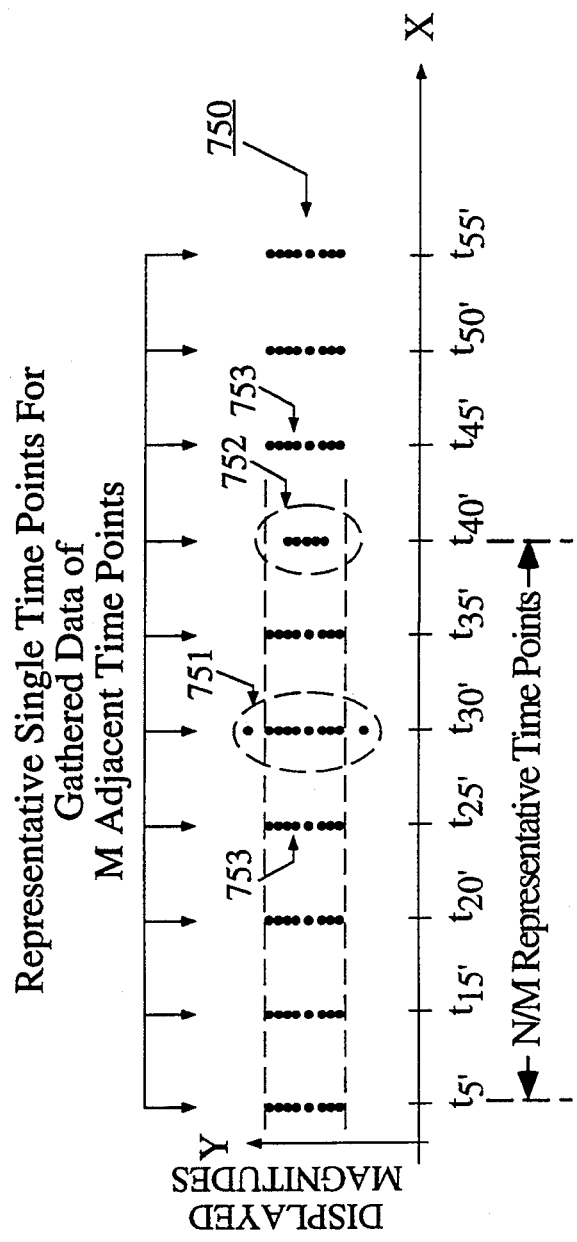

Referring to FIGS. 7D, 7E and 7F, the CHART output in the "time-points gathering" mode will now be explained. FIG. 7D is a plot 700 of an original number N of data values collected over an equal number N of time points. The collected data may be generally repetitive (i.e., a periodic function) as shown but can include a number of "glitches" such as over shoot spikes 710 and drop out regions 720. It is to be understood that the glitches 710 and/or 720 are relatively short in duration and occur infrequently, say only once in every 100 or 1000 cycles of the repetitive data. Accordingly it is difficult for a user to easily see these glitches 710 or 720 in the plot 700 of FIG. 7D particularly when the plot 700 covers thousands of cycles.

FIG. 7E is a plot 750 of the displayed magnitudes of the original data after time-gathering. Each representative or median time line (i.e., $t_5'$, $t_{15}'$, $t_{20}'$, etc.) of FIG. 7E has the data of a number M of adjacent time points gathered into it and plotted along its time line. For example, in the case of M=10 all ten data values of original sample times $t_{10}$ through $t_{19}$ are each plotted as a plot point (one overstruck on the next if necessary) along the median time line $t_{15}'$. The width of the data gathering window 715 shown in FIG. 7D may be adjusted as desired to establish any value of M in the range, $1<M<N$. Thus, in FIG. 7E there are N/M representative time lines displayed across the screen (or page) rather than all N time points of FIG. 7D and the horizontal (X) axis is thereby compressed. This is particularly advantageous where the X axis density is such that a single frame or page cannot hold all N time points but can contain the smaller number of N/M representative time points. The occurrence of signal over-shoots 710 and drop-outs 720 nonetheless stand out and are easily discernable by the variances observed respectively at 751 and 752 as compared to the adjacently displayed gatherings 753 of data points.

FIG. 7F shows another time-gathered plot 760 of the original data from FIG. 7D. The size of the time gathering window 715 has been shrunk here to collect a fewer number $M'<M$ of adjacent time points into each representative time point. The shape of the original sine-function waveform is thus more readily discernable but glitches 710 and 720 are still captured. It should be apparent that various combination of sizes for the time gathering window 715 and distances 716 between representative time points are contemplated.

While FIGS. 7E and 7F show the effect of using only the time-points gathering technique of the invention, it is also well within the contemplation of the invention to compound the time-points gathering technique with the averaging over-time technique and/or the time-point skipping techniques earlier described. The software of accompanying Appendix A includes routines for allowing multiple data points to be "overprinted" or "overstruck" one on the next along a single time line (representative X axis value) so that time base compression may take place. The multiple data point values of each time line can be further averaged across time (along the X axis) and compressed using the time-point skipping technique. The order of operations may be changed as desired so that for example, time-point skipping takes place first, then the skip-generated data is averaged over time, and then the averaged data is further compressed using the time-points gathering method.

The above described methods and devices are, of course, only exemplary of the invention. Numerous variations and modifications will become apparent to those skilled in the art after studying the above disclosure. Accordingly, the above disclosure should not be taken in a limiting sense. Reference to the following claims should be made to determine that which is claimed here.

We claim:

1. A data display system comprising:
   data receiving means for receiving a first series of data samples from a first samples source, said first series of data samples having associated therewith a hypothetical first high-fidelity plot containing every data sample in the first series of data samples, the hypothetical first high-fidelity plot having a waveshape and other visually recognizable attributes associated therewith;
   dividing means for dividing the first series of data samples into groups of data samples, each group having two or more samples;
   representation means for providing for each group of data samples, a representative value representing the data samples of the group; and
   plotting means for plotting the representative value of each group;
   wherein the dividing means and representation means function so as to enable substantial visual recognition of the waveshape associated with the first hypothetical high-fidelity plot from the plot of the representative values.

2. The data display system of claim 1 wherein the dividing means includes a 1-of-every-n sampling means for selecting a representative one data sample from each group of n data samples, n being an integer greater than one, and wherein the representation means provides the representative one data sample of each group of n data samples to the plotting means.

3. The data display system of claim 1
   wherein the dividing means includes means for dividing the first series of data samples into groups each having a first number of bits and the representation means includes data reducing means for generating the representative value in a small-sized form having a second number of bits less than the first number of bits;
   wherein the plotting means operates at a throughput rate which is less than a source rate at which the first samples source supplies said first series of data samples;
   and further wherein the small-sized form of the representative value is adjusted so as to enable the plotting means to keep pace with the source rate at which the first samples source supplies said first series of data samples.

4. The display system of claim 3 wherein the representative value is equal to one of an average, maximum or minimum value of the data samples in its corresponding group.

5. The display system of claim 1 further comprising:
   analog to digital (A/D) converting means for producing the first series of data samples, said A/D converting means having a user-definable gain; and
   guideline means, operatively coupled to the plotting means and responsive to the user-definable gain, for drawing a calibration guideline on the plot of the representative values of each group.

6. The display system of claim 1 wherein:
   the plotting means is adapted to transmit a plot of said representative values to a preselected plot display means having pixels organized as a preselected number of display columns and display rows;
   the plotting means includes data transforming means for transforming representative values provided by the representation means into row and column coordinated plot data which is compatible with the preselected plot display means; and
   the data transforming means operates at a throughput rate which is less than a source rate at which the first samples source supplies said first series of data samples.

7. The system of claim 6 wherein:
   the display means includes means for displaying information in different colors;
   the data receiving means is adapted for receiving a second series of data samples from a second samples source, said second series of data samples having associated therewith a hypothetical second high-fidelity plot containing every data sample in the second series of data samples, the hypothetical second high-fidelity plot having a waveshape and other visually recognizable attributes associated therewith;
   the dividing means is adapted for dividing the second series of data samples into second groups of data samples, each second group having two or more samples;
   the representation means is adapted for providing for each second group of data samples, a representative value representing the data samples of the second group, the representative values of the first and second groups respectively forming first and second representative plots for the first and second series of data samples;
   the plotting means includes color assigning means for assigning an individual color to each of the representative plots of the first and second series of data samples; and
   the means for displaying information displays the representative plots in the colors assigned to the representative plots.

8. The system of claim 6 wherein the display means includes a hardcopy printer.

9. The data display system of claim 1 wherein the number of samples per representative value is 100 or less.

10. The data display system of claim 1 wherein the number of samples per representative value is 50 or less.

11. The data display system of claim 1 further comprising
    display ratio adjusting means for allowing a viewer of a plot produced by the plotting means to adjust the number of samples per representative value while viewing the plot.

12. The data display system of claim 1 wherein the data receiving means includes:
- buffer means for temporarily storing the received data samples, said buffer means being operatively coupled to the plotting means for transferring data to be plotted to the plotting means by way of the dividing means and the representation means;
- mass storage means for more permanently storing the received data samples; and
- control means, operatively coupled to the buffer means and the mass storage means, for controlling transfer of data between the buffer means and the mass storage means, said control means also controlling transfer of data from the buffer means to the plotting means by way of the dividing means and the representation means;

and wherein the data display system further comprises:
- automatic display ratio adjusting means for automatically adjusting the number of samples per representative value so that the controlling by the control means of data transfer between the buffer means and the mass storage means is not hampered by the controlling by the control means of data transfer from the buffer means to the plotting means by way of the dividing means and the representation means.

13. The data display system of claim 1 wherein the dividing means divides the first series of data samples into groups of data samples, each group having a same number of samples.

14. The data display system of claim 1 wherein the data receiving means is adapted to receive the first series of data samples at a first rate and the plotting means is adapted for plotting values at a substantially slower, second rate.

15. The data display system of claim 1 wherein the first series of data samples are produced in real time and at a first sampling rate from sampled measurements of physical quantities and the plotting means is adapted for plotting values at a second rate that is substantially slower than the first sampling rate.

16. The data display system of claim 1 wherein
- the data receiving means is adapted for further receiving second through Nth series of data samples from second through Nth samples sources, said second through Nth series of data samples having associated therewith a hypothetical second through Nth high-fidelity plots each respectively containing every data sample in the respective second through Nth series of data samples, the hypothetical second through Nth high-fidelity plots having respective waveshapes and other visually recognizable characteristics associated therewith;
- the dividing means is adapted for dividing the second through Nth series of data samples into respective second through Nth groups of data samples, each of the second through Nth groups having two or more samples;
- the representation means is adapted for providing for each of the second through Nth groups of data samples, a representative value representing the data samples of the respective second through Nth group, the representative—values of the first through Nth groups respectively forming first through Nth representative plots for the first through Nth series of data samples; and
- the plotting means is adapted for further plotting the representative values of each of the second through Nth groups;
- wherein the dividing means and representation means function so as to enable substantial visual recognition of the waveshapes associated with the first through Nth hypothetical high-fidelity plots from the plots of the first through Nth representative values.

17. The data display system of claim 1 wherein:
- the data receiving means has a throughput rate of at least 12000 samples per second per sample source; and
- the number of samples per representative value is adjusted to allow the plotting means to plot the representative values substantially in pace with said throughput rate of the data receiving means.

18. The data display system of claim 1 wherein the plotting means plots the representative value of each group on a plot surface of limited area, the plot surface having first and second plotting axes of limited extent, said data display system further comprising:
- display gain control means for adjusting a gain applied in plotting the representative values against at least one axis of the plot surface so that, with appropriate adjustment of the gain, the plot of the representative values can be spread across the full extent of the at least one axis.

19. A computer system comprising:
- CALIBRATE means for generating a calibration file having first information defining units of measurement of a physical quantity for association with raw data numbers that are to be stored in a raw data file and that are to represent samples of a measured physical quantity, and having second information defining calibration equations for converting the raw data numbers into calibrated physical quantity measurement values;
- COLLECT means for collecting raw data produced by a raw data producing means and displaying a plot representative of such raw data;
- REPLAY means for reproducing the raw data collected by the COLLECT means;
- CHART means for producing a hard copy plot of the collected data, said hard copy including one or more guidelines indicating preselected levels of physical quantity measure conforming with the calibration equations of said CALIBRATE means.

20. A plot generating system for generating one or more real-time plots showing characteristic waveforms of incoming digital data points sampled from physical signals, said plot generation occurring during substantially simultaneous transfer of the incoming data points to, or from, permanent storage, where the incoming digital data points can be represented by hypothetical high-fidelity plots containing every one of the incoming digital data points, said system comprising:
- representative value generating means for generating for each plurality of incoming data points, a single representative point providing representative information about the plurality of points, each representative value consuming fewer bits than the digital data points it represents; and
- plotting means for plotting representative values generated by the generating means;
- wherein the combination of the representative value generating means and the plotting means function to enable substantial visual recognition of the waveshape associated with the hypothetical high-fidelity plots from the plots of the representative values.

21. The plot generating system of claim 20 wherein the plotting means includes a printer having a fixed sheet feeding speed, and the number of incoming data points represented by each representative point is varied to simulate a variable sheet-feeding speed.

22. The plot generating system of claim 21 wherein the plotting means is a laser printer.

23. A method for compressing points plotted on a graph having first and second coordinate axes, the method comprising the steps of:

generating a first number N of data points each having associated therewith a unique one of a corresponding number N of unique first axis points and a predetermined one of a corresponding number N* of second axis points where N* is equal to or less than N;

dividing the set of N unique first axis points to define a smaller number of N/M first axis subsets where each first axis subset contains a plurality of first axis points and where M is a number greater than unity;

assigning a unique identifier point from a succession of identifier points to each of the N/M first axis subsets;

dividing the set of N data points into N/M data point subsets each containing a plurality of data points;

linking each of the N/M data point subsets with the corresponding unique identifier point which identifies the subset of first axis points with which the data points of the data point subset are associated; and plotting the data points of each data point subset over the corresponding unique identifier point which was linked to that data point subset, thereby plotting the N data points over a number of N/M identifier points, the number of said identifier points being less than N.

24. The method of claim 23 wherein the first coordinate axis is a time line.

25. The method of claim 24 wherein the second coordinate axis is a voltage line.

26. The method of claim 24 wherein the data points are sample points collected in real time from measurements of a time varying physical quantity.

27. The method of claim 23 wherein M is equal to or greater than 2 and each data point subset contains M data points.

28. The method of claim 23 wherein the N data points belong to a series of successively generated data points, the method further comprising the step of skipping over a predetermined fraction of the successively generated data points and not including these skipped over data points in the data point subsets.

29. A method for compressing the display of a large number N of data points, said N data points having associated therewith a hypothetical high-fidelity plot containing every data point of the N data points, the method comprising:

dividing the set of N data points into N/M subsets, each subset containing a plurality of data points, M being a value greater than unity;

for each subset, generating a representative data point whose value is representative of the data points in the subset; and plotting only the representative data points rather than all N data points;

wherein the dividing and representation steps enable substantial visual recognition of the waveshape associated with the first hypothetical high-fidelity plot from the plot of the representative values; and wherein said N data points represent real time measurements of a time-varying physical quantity.

30. The method of claim 29 including the step of selecting N to be a number greater than 999.

31. The method of claim 30 including the step of selecting M to be a number equal to or greater than 10.

32. The method of claim 29 wherein the generating step comprises selecting one of the data points in the subset as representative of the other data points in the subset.

33. The method of claim 29 wherein the generating step comprises averaging over the plural data points of the subset to generate the representative data point.

34. A method for compressing the display of a large number N of data points, said N data points having associated therewith a hypothetical high-fidelity plot containing every data point of the N data points, the method comprising:

dividing the set of N data points into N/M subsets, each subset containing a. plurality of data points, M being a value greater than unity;

for each subset, generating a representative data point whose value is representative of the data points in the subset;

plotting only the representative data points rather than all N data points;

wherein the dividing and representation steps enable substantial visual recognition of the waveshape associated with the first hypothetical high-fidelity plot from the plot of the representative values; and varying the value of M during said plotting to thereby provide a desired degree of fidelity in the plot of the representative values.

* * * * *